(12) United States Patent
Petrina et al.

(10) Patent No.: US 12,155,389 B2
(45) Date of Patent: Nov. 26, 2024

(54) METHODS AND APPARATUS FOR CROSS-CONDUCTION DETECTION

(71) Applicant: Texas Instruments Incorporated, Dallas, TX (US)

(72) Inventors: Gaetano Maria Walter Petrina, Kirchdorf an der Amper (DE); Michael Lueders, Freising (DE); Nicola Rasera, Unterschleißheim (DE)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 18/212,213

(22) Filed: Jun. 21, 2023

(65) Prior Publication Data
US 2023/0336167 A1   Oct. 19, 2023

Related U.S. Application Data

(62) Division of application No. 16/719,813, filed on Dec. 18, 2019, now Pat. No. 11,728,798, which is a division of application No. 15/993,144, filed on May 30, 2018, now Pat. No. 10,547,296.

(60) Provisional application No. 62/513,319, filed on May 31, 2017.

(51) Int. Cl.
| H03K 5/1534 | (2006.01) |
| H02M 1/08 | (2006.01) |
| H02M 1/38 | (2007.01) |
| H03K 5/00 | (2006.01) |
| H03K 5/13 | (2014.01) |

(52) U.S. Cl.
CPC ............ *H03K 5/1534* (2013.01); *H02M 1/08* (2013.01); *H02M 1/38* (2013.01); *H03K 5/13* (2013.01); *H03K 2005/00078* (2013.01)

(58) Field of Classification Search
CPC ........ H02M 1/08; H02M 1/081; H02M 1/082; H02M 1/083; H02M 1/084; H02M 1/0845; H02M 1/088; H02M 1/092; H02M 1/096
See application file for complete search history.

(56) References Cited

U.S. PATENT DOCUMENTS

| 4,791,326 A | 12/1988 | Vajdic |
| 5,886,543 A | 3/1999 | Moody |
| 6,262,616 B1 | 7/2001 | Srinivasan |
| 9,225,351 B2 | 12/2015 | Itakura |
| 9,444,321 B2 * | 9/2016 | Xu ........................ G01R 19/175 |
| 10,096,346 B2 | 10/2018 | Fritsch |
| 10,152,072 B1 | 12/2018 | Elhebeary et al. |
| 2006/0158158 A1 | 7/2006 | Eberlein |
| 2010/0134086 A1 | 6/2010 | Theil |
| 2013/0033904 A1 | 2/2013 | Ye |

(Continued)

*Primary Examiner* — Patrick C Chen
(74) *Attorney, Agent, or Firm* — Ray A. King; Frank D. Cimino

(57) ABSTRACT

Methods, apparatus, systems, and articles of manufacture are disclosed for cross-conduction detection. An example apparatus includes a cross detector circuit including a first transistor and a second transistor, the first transistor coupled to a load, a third transistor coupled to a first controlled delay circuit and the first transistor, a fourth transistor coupled to a second controlled delay circuit and to the third transistor at a phase node, and a control circuit coupled to the first controlled delay circuit, the second controlled delay circuit, and the load.

7 Claims, 9 Drawing Sheets

(56) References Cited

U.S. PATENT DOCUMENTS

| | | |
|---|---|---|
| 2013/0063984 A1 | 3/2013 | Sandner et al. |
| 2014/0016361 A1 | 1/2014 | Weis |
| 2014/0043006 A1 | 2/2014 | Tan |
| 2016/0252919 A1 | 9/2016 | Tanaka |
| 2016/0269029 A1 | 9/2016 | Chou |

\* cited by examiner

METHODS AND APPARATUS FOR CROSS-CONDUCTION DETECTION

RELATED APPLICATION

Under 35 U.S.C. §§ 119(e), 121, this divisional application claims the benefit of priority to U.S. patent application Ser. No. 16/719,813, filed on Dec. 18, 2019, which claims the benefit of priority to U.S. patent application Ser. No. 15/993,144, filed on May 30, 2018, now U.S. Pat. No. 10,547,296, which claims the benefit of priority to U.S. Provisional Patent Application Ser. No. 62/513,319, filed on May 31, 2017. The above referenced applications are hereby incorporated herein for all purpose in their entirety.

FIELD OF THE DISCLOSURE

This disclosure relates generally to power converters and, more particularly, to methods and apparatus for cross-conduction detection.

BACKGROUND

A power converter such as a switched mode power supply (SMPS) converts an input voltage to a regulated output voltage, controls switching transistors to transfer input power through energy storage elements (for example, an inductor and/or capacitor) to a load, and supplies load current at the regulated output voltage. An SMPS regulator includes a controller that drives one or more switching transistors coupled at a switching node to the energy storage element(s). In a common configuration, an SMPS regulator (such as buck, boost, buck-boost) includes a power converter/switcher (controller and switching transistor(s)) coupled to an energy storage inductor at a switch node that is switched to form circuit arrangements to supply inductor current to the load, and to an output capacitor in parallel with the load, switched between charge/discharge cycles to maintain the regulated output voltage, and to supply load current.

BRIEF DESCRIPTION OF THE DRAWINGS

The figures are not to scale. In general, the same reference numbers will be used throughout the drawing(s) and accompanying written description to refer to the same or like parts.

DETAILED DESCRIPTION

Figure 1:
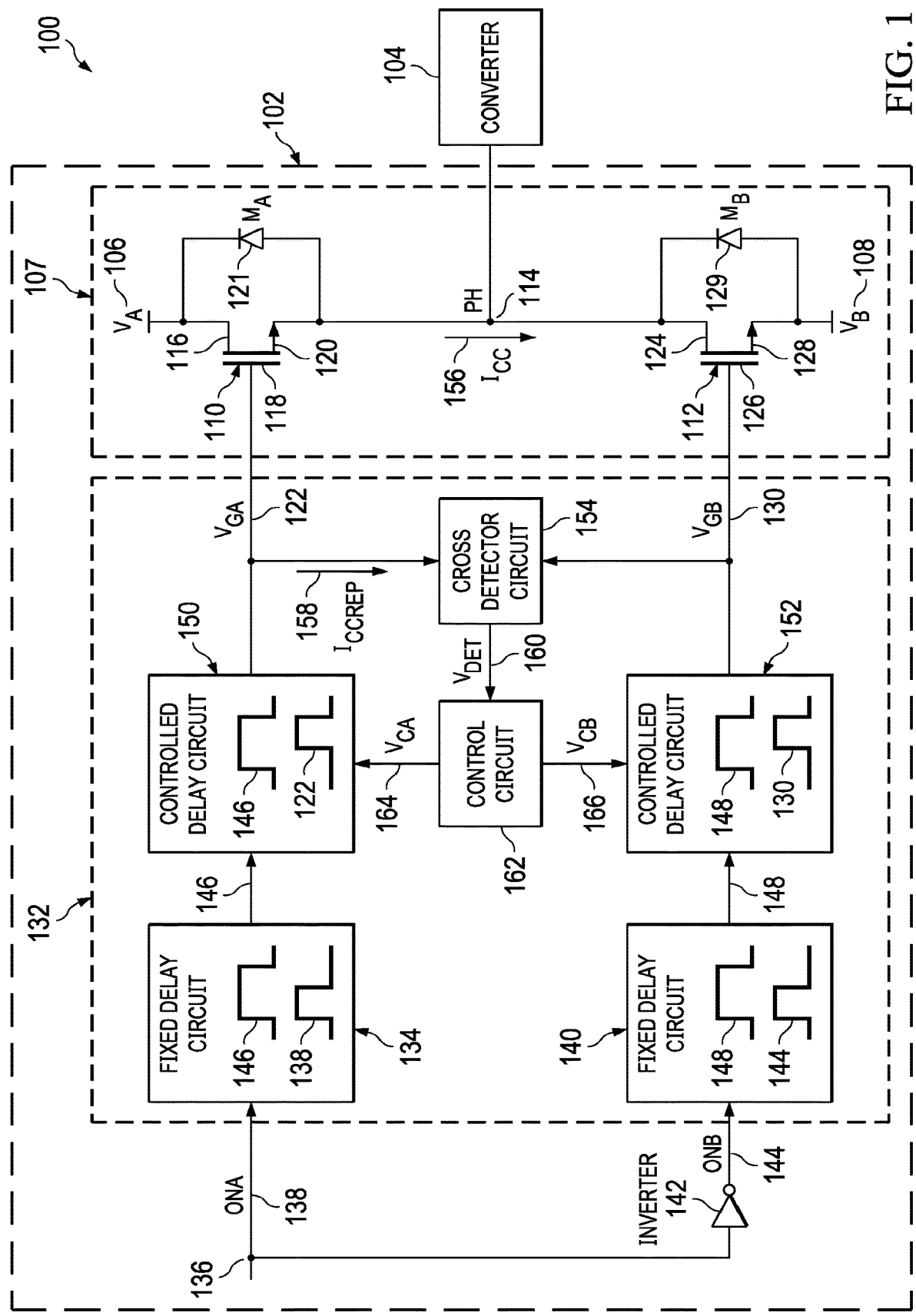
FIG. 1 is a schematic illustration of an example power conversion system, with an example phase switching network and example converter to implement the examples described herein

Switched mode power converters (e.g., boost converters, buck converters, buck-boost converters, etc.) are used to convert a first voltage (e.g., an input voltage) to a second voltage (e.g., an output voltage). Such power converters include a switching network including one or more switching transistors coupled to a switching node that is switched to form circuit arrangements to direct current through an energy storage inductor and/or to charge/discharge an output capacitor. Such circuit arrangements supply load current and regulate the output voltage to remain substantially steady at the second voltage. The switching network can include one or more drivers coupled (e.g., directly or indirectly) to the control terminals of switching (power) transistors, such as the gates of bipolar junction transistors (BJTs) or metal oxide semiconductor field effect transistors (MOSFETs) (e.g., P-Channel MOSFETs, N-Channel MOSFETs, etc.).

In some power converter design examples, the power converter includes one or more drivers coupled to a high-side transistor and a low-side transistor. The high-side transistor, when enabled, allows current to flow from supply, or a first phase voltage, through an inductor to an output capacitor, thereby charging the output capacitor and increasing the output voltage. The low-side transistor, when enabled, allows current to flow to a second phase voltage, thereby decreasing the output voltage. Power converters switch between high-side control (e.g., enabling the high-side transistor and disabling the low-side transistor to increase the output voltage) and low-side control (e.g., disabling the high-side transistor and enabling the low-side transistor to decrease the output voltage) to provide a substantially stable or otherwise regulated output voltage.

In some power converter design examples, cross conduction can occur when both high-side and low-side transistors are enabled at the same time. For example, when transitioning from enabling the low-side transistor to enabling the high-side transistor, the low-side transistor may still be enabled while in the process of turning off when the high-side transistor becomes enabled. In such an example, cross-conduction current or shoot-through current can flow or pass from supply or a positive supply rail through both transistors to ground or a negative supply rail and cause damage to one or both transistors and/or components proximate to the one or both transistors.

The cross-conduction current can inject noise into the substrate to which the transistors are coupled when the transistors are conducting a current to a ground supply or a negative voltage supply rail. For example, the cross-conduction current can travel to surrounding electron collectors (e.g., a collector of a BJT, a drain of a MOSFET, etc.) through the substrate and create a direct current (DC) offset. The DC offset may impact electrical components coupled to the surrounding electron collectors by causing unexpected circuit behavior. In some examples, cross-conduction events (e.g., a generation or a presence of cross-conduction current) can cause a substrate bandgap voltage to shift. In such power converter design examples, the substrate bandgap voltage is used as a reference voltage and, thus, shifts in the substrate bandgap voltage can degrade the performance of electrical components coupled to the substrate and/or cause erratic circuit behavior.

In some prior power converter implementations, the power converter included a fixed break-before-make circuit to address cross conduction. Such a circuit inserts and/or otherwise causes a fixed delay between a switch-off of one switching transistor and a switch-on of the other switching transistor. The fixed delay is designed for the worst-case timing (e.g., a maximum dead time). However, the fixed delay typically results in too large of a delay under typical operating conditions and, thus, reduces efficiency of the power converter.

In some prior power converter implementations, the power converter included an adaptive delay circuit to attempt mitigating cross conduction based on measuring a forward voltage of a body diode of one switching transistor. The adaptive delay circuit inserts and/or otherwise causes a varying delay between a switch-off of one switching transistor and a switch-on of the other switching transistor based on the body diode forward voltage. However, the body diode forward voltage is indirectly related to the cross-conduction between switching transistors and, thus, results in either too large of a delay or too small of a delay that reduces efficiency of the power converter. For example, a reduction in the forward voltage across the body diode does not correspond to the switching transistors reaching a minimum and/or otherwise optimum dead time.

Examples disclosed herein minimize and/or otherwise optimize a dead time between power switching events of transistors included in a power conversion system. Examples disclosed herein measure (e.g., directly measure) a cross-conduction current flowing between two or more switching transistors and apply an adaptive time delay based on the cross-conduction current to an input signal to reduce and/or otherwise eliminate the cross-conduction current. By reducing the cross-conduction current, a dead time between power switching events can be reduced and, thus, an efficiency of the power conversion system can be increased.

In some disclosed examples, a power conversion system includes a phase switching network including two or more switching transistors coupled to a converter such as a boost converter, a buck converter, a boost-buck converter, etc. In some disclosed examples, the phase switching network includes a cross conduction control (CCC) circuit to increase an efficiency of the converter by minimizing and/or otherwise optimizing a dead time between alternately turning on and off the two or more switching transistors.

In some disclosed examples, the CCC circuit includes two substantially similar and/or otherwise identical fixed delay circuits to obtain an input signal and delay a falling edge of the input signal by a fixed amount of time. In some disclosed examples, the CCC circuit includes two substantially similar and/or otherwise identical controlled delay circuits coupled to corresponding fixed delay circuits to delay a rise time of the input signal by a varying amount of time (e.g., an adaptive time delay, a varying time delay, etc.). In some disclosed examples, the CCC circuit determines the adaptive time delay by including a control circuit to generate a control signal proportional to the adaptive time delay. For example, the control circuit can generate the control signal based on a cross-conduction current and transmit the control signal to the controlled delay circuits. The controlled delay circuits can apply the adaptive time delay to the rise time of the input signal based on the proportional control signal.

In some disclosed examples, the CCC circuit includes a cross detector circuit to measure a scaled cross-conduction current corresponding to a cross-conduction current flowing between two switching transistors and transmit a voltage based on the scaled cross-conduction current to the control circuit to process. In some disclosed examples, the cross detector circuit includes two cross detector transistors substantially similar and/or otherwise identical to the two switching transistors. In some disclosed examples, one of the two cross detector transistors is coupled to a load to convert the scaled cross-conduction current to the voltage to be used by the control circuit to cause the controlled delay circuits to apply the adaptive time delay to the rising edge of the input signal. In some disclosed examples, the phase switching circuit can operate between a no cross conduction state and a negligible cross conduction state to maintain a reduced and/or otherwise optimum dead time to improve an efficiency of the power conversion system.

FIG. 1 is a schematic illustration of an example power conversion system 100, with an example phase switching network 102 and an example converter 104. In FIG. 1, the converter 104 is a power converter. For example, the converter 104 may be a boost converter, a buck converter, a boost-buck converter, etc., or any other type of power converter or energy altering device.

In the illustrated example of FIG. 1, the power conversion system 100 includes the phase switching network 102 to alternately provide the converter 104 with different phases corresponding to a first voltage (VA) 106 or a second voltage (VA) 108. In FIG. 1, the phase switching network 102 includes an example switching transistor network 107 that includes a first example transistor 110 (MA), or a first example switching transistor (MA) 110, and a second example transistor (MB) 112, or a second example switching transistor (MB) 112, coupled to an example phase node (PH) 114. The switching transistor network 107 alternately provides the first voltage 106 or the second voltage 108 to the phase node 114 via one or more power switching operations of the first and second switching transistors 110, 112.

In FIG. 1, the phase node 114 is coupled to the converter 104. For example, the phase node 114 may be coupled to a first terminal of an inductor of the converter 104. In such examples, the converter 104 may be a buck converter when a second terminal of the inductor is coupled to $V_{OUT}$, $V_A=V_{IN}$, and $V_B$ is coupled to ground. In other examples, the converter 104 may be a boost converter when the second terminal of the inductor is connected to $V_{IN}$, $V_A=V_{OUT}$, and $V_B$ is coupled to ground. In yet other examples, the converter 104 may be a buck-boost converter when the second terminal of the inductor is coupled to ground, $V_A=V_{IN}$, and $V_B=V_{OUT}$.

In FIG. 1, the first switching transistor 110 and the second switching transistor 112 are N-Channel MOSFETs. Alternatively, the first and second switching transistors 110, 112 may be P-Channel MOSFETs, PNP BJTs, NPN BJTs, etc.

Alternatively, the first switching transistor 110 and the second switching transistor 112 may be a switch or any other type of power switching device. In FIG. 1, the first switching transistor 110 includes a first drain terminal 116, a first gate terminal 118, and a first source terminal 120. In FIG. 1, a first diode 121 is a body diode of the first switching transistor 110. In FIG. 1, the first diode 121 is depicted as being coupled to the first drain terminal 116 and the first source terminal 120 to represent the body diode of the first switching transistor 110.

In FIG. 1, the first switching transistor 110 can enter a triode operation mode when a first gate signal ($V_{GA}$) 122, or a first gate voltage ($V_{GA}$) 122 is applied to the first gate terminal 118 that is greater than a drain voltage at the first drain terminal 116 and greater than an emitter voltage at the first source terminal 120. In the triode operation mode, the first switching transistor 110 acts like a short circuit where current flows freely from the first drain terminal 116 to the first source terminal 120. The first switching transistor 110 can enter a cut-off operation mode when the first gate voltage 122 is removed from the first gate terminal 118 so that the gate voltage at the first gate terminal 118 is less than the drain voltage at the first drain terminal 116 and less than the source voltage at the first source terminal 120.

In FIG. 1, the second switching transistor 112 includes a second drain terminal 124, a second gate terminal 126, and a second source terminal 128. In FIG. 1, a second diode 129 is a body diode of the second switching transistor 112. In FIG. 1, the second diode 129 is depicted as being coupled to the second drain terminal 124 and the second source terminal 128 to represent the body diode of the second switching transistor 112. In operation, the first diode 121 and the second diode 129 operate as suppressor diodes (e.g., flyback diodes, kickback diodes, snubber diodes, etc.). The diodes 121, 129 of FIG. 1 are used to eliminate and/or otherwise suppress flyback, or the sudden voltage spike seen across an inductive load of the converter 104 in between power switching operations of the first and second switching transistors 110, 112.

The second switching transistor 112 of FIG. 1 can enter a triode operation mode when a second gate signal ($V_{GB}$) 130, or a second gate voltage ($V_{GB}$) 130 is applied to the second gate terminal 126 that is greater than a drain voltage at the second drain terminal 124 and greater than a source voltage at the second source terminal 128. In the triode operation mode, the second switching transistor 112 acts like a short circuit where current flows freely from the second drain terminal 124 to the second source terminal 128. The second switching transistor 112 can enter a cut-off operation mode when the second gate voltage 130 is removed from the second gate terminal 126 so that the gate voltage at the second gate terminal 126 is less than the drain voltage at the second drain terminal 124 and less than the source voltage at the second source terminal 128.

In some examples, a power switching operation includes turning on a switching transistor by applying a gate voltage. For example, a power switching operation may include turning on the first switching transistor 110 by applying the first gate voltage 122 to the first gate terminal 118. In another example, a power switching operation may include turning on the second switching transistor 112 by applying the second gate voltage 130 to the second gate terminal 126.

In some examples, a power switching operation includes turning off a switching transistor by removing a gate voltage. For example, a power switching operation may include turning off the first switching transistor 110 by removing the first gate voltage 122 from the first gate terminal 118. In another example, a power switching operation may include turning off the second switching transistor 112 by removing the second gate voltage 130 from the second gate terminal 126.

In some examples, cross conduction occurs between the first switching transistor 110 and the second switching transistor 112. For example, the first switching transistor 110 may be on when the second switching transistor 112 is turned on and, thus, enabling current to flow or pass through the first and second switching transistors 110, 112. One or both of the first and second switching transistors 110, 112 can become damaged due to the increased current flowing through the first and second switching transistors 110, 112.

In FIG. 1, the phase switching network 102 includes an example cross conduction control (CCC) circuit 132 to measure cross conduction associated with the first and second switching transistors 110, 112. In FIG. 1, the CCC circuit 132 includes a first example fixed delay circuit 134 coupled to an example input node 136 to obtain a first example input signal (ONA) 138 from the input node 136. In FIG. 1, the CCC circuit 132 includes a second example fixed delay circuit 140 coupled to the input node 136 via an example inverter 142 to obtain a second example input signal (ONB) 144 from the input node 136. In FIG. 1, the first fixed delay circuit 134 is substantially similar and/or otherwise identical to the second fixed delay circuit 140. Alternatively, the first fixed delay circuit 134 may be different from the second fixed delay circuit 140. In FIG. 1, the inverter 142 inverts the first input signal 138 to generate the second input signal 144. For example, the inverter 142 can invert a high signal of 5 volts to a low signal of 0 volts.

In FIG. 1, the first fixed delay circuit 134 delays a falling edge of the first input signal 138 by a fixed amount of time to generate a first fixed delay signal 146, or a first falling edge delayed signal 146. For example, the first fixed delay circuit 134 can delay a falling edge of the first input signal 138 by a fixed amount of time (e.g., 1 nanosecond, 10 nanoseconds, 100 nanoseconds, etc.) to generate the first fixed delay signal 146 every clock cycle (e.g., every 1 nanosecond, 10 nanoseconds, 100 nanoseconds, etc.) of the power conversion system 100. In FIG. 1, the first fixed delay circuit 134 can be an RC network (e.g., an integration to create delay) coupled to a buffer (e.g., a digital buffer) (e.g., to square the signal). In other examples, the first fixed delay circuit 134 may be a counter.

In FIG. 1, the second fixed delay circuit 140 delays a falling edge of the second input signal 144 by the same fixed amount of time associated with the first fixed delay circuit 140 to generate a second fixed delay signal 148, or a second falling edge delayed signal 148. Alternatively, the second fixed delay circuit 140 may delay the falling edge of the second input signal 144 by a different amount of time compared to the first fixed delay circuit 134. In FIG. 1, the second fixed delay circuit 140 can be an RC network (e.g., an integration to create delay) coupled to a buffer (e.g., a digital buffer) (e.g., to square the signal). In other examples, the second fixed delay circuit 140 may be a counter. Alternatively, the first fixed delay circuit 134 and the second fixed delay circuit 140 may be implemented using one fixed delay circuit that includes two inputs (e.g., two or more input pins) to receive the first input signal 138 and the second input signal 144 and two outputs (e.g., two or more output pins) to transmit the first fixed delay signal 146 and the second fixed delay signal 148.

In FIG. 1, the first fixed delay circuit 134 is coupled to a first example controlled delay circuit 150, or a first example adaptive delay circuit 150. In FIG. 1, the first controlled delay circuit 150 delays a rising edge of the first fixed delay signal 146 to generate the first gate voltage 122. In FIG. 1, the second fixed delay circuit 140 is coupled to a second example controlled delay circuit 152, or a second example adaptive delay circuit 152. In FIG. 1, the second controlled delay circuit 152 delays a rising edge of the second fixed delay signal 148 to generate the second gate voltage 130.

In FIG. 1, the first controlled delay circuit 150 and/or the second controlled delay circuit 152 can be an RC network (e.g., an integration to create delay) coupled to a digital buffer (e.g., to square the signal), where the RC network includes one or more capacitors and/or one or more switches. For example, the one or more capacitors can be coupled to each other in series and can be switched from being in series to being in parallel in response to one or more of the switches being turned on/off. In such examples, the switch(es) can be turned on/off to change a total capacitor value of the capacitor(s) to change an RC time constant of the RC network to increase or decrease a delay generated by the first controlled delay circuit 150 and/or the second controlled delay circuit 152. In other examples, the first controlled delay circuit 150 and/or the second controlled delay circuit 152 may be one or more counters.

The first controlled delay circuit 150 of FIG. 1 is substantially similar and/or otherwise identical to the second controlled delay circuit 152. Alternatively, the first controlled delay circuit 150 may be different from the second controlled delay circuit 152. Alternatively, the first controlled delay circuit 150 and the second controlled delay circuit 152 may be implemented using and/or otherwise replaced with one controlled delay circuit.

In the illustrated example of FIG. 1, the first and second controlled delay circuits 150, 152 alternately generate the first gate voltage 122 and the second gate voltage 130 to alternately turn on and off the first and second switching transistors 110, 112. The controlled delay circuits 150, 152 apply an adaptive time delay to the first and second fixed delay signals 146, 148 to reduce a dead time between power switching operations of the first and second switching transistors 110, 112. The adaptive time delay is based on a presence and/or a magnitude of cross conduction associated with the first and second switching transistors 110, 112.

In FIG. 1, the CCC circuit 132 includes an example cross detector circuit 154, or an example cross conduction detection circuit 154, to determine that a first example cross-conduction current ($I_{CC}$) 156 is flowing between the first and second switching transistors 110, 112 based on a second example cross-conduction current ($I_{CCREF}$) flowing through the cross detector circuit 154. In some examples, the first and second switching transistors 110, 112 of FIG. 1 are enabled simultaneously causing cross conduction to occur between the first and second switching transistors 110, 112. For example, the first and second switching transistors 110, 112 of FIG. 1 may be on substantially simultaneously enabling the first cross-conduction current 156 to flow through the first and second switching transistors 110, 112.

In FIG. 1, the cross detector circuit 154 measures the second example cross-conduction current ($I_{CCREF}$) 158, which is a scaled replica cross-conduction current compared to the first cross-conduction current 156. In FIG. 1, the second cross-conduction current 158 is a smaller cross-conduction current (e.g., a proportionally smaller cross-conduction current) compared to the first cross-conduction current 156. The cross detector circuit 154 of FIG. 1 may include substantially similar and/or otherwise identical switching transistors compared to the first and second switching transistors 110, 112 of FIG. 1 to measure the second cross-conduction current 158. In response to measuring the second cross-conduction current 158, the cross detector circuit 154 generates and transmits an example detected voltage ($V_{DET}$) 160, or an example cross-conduction voltage 160, to an example control circuit 162. In FIG. 1, the cross-conduction voltage 160 is a voltage (e.g., a cross conduction detection voltage) associated with a cross conduction of the first and second switching transistors 110, 112. For example, the cross-conduction voltage 160 is generated by the second cross-conduction current 158 and based on the first cross-conduction current 156.

In the illustrated example of FIG. 1, the CCC circuit 132 includes the control circuit 162 to generate a first control signal ($V_{CA}$) 164 and/or a second control signal ($V_{CB}$) 166. In FIG. 1, the control circuit 162 can include an amplifier to amplify the detected voltage 160 to increase sensitivity and a filter to prevent false triggering of the first and/or second control signals 164, 166 due to noise. In other examples, the control circuit 162 can be implemented using a digital circuit where the detected voltage 160 is constrained in certain examples (e.g., high or light loads, CCM/DCM mode, etc.).

In FIG. 1, the control circuit 162 generates the first and second control signals 164, 166 based on the detected voltage 160. For example, the first and second control signals 164, 166 may be proportional and/or otherwise mapped to the detected voltage 160. In FIG. 1, the first and second control signals 164, 166 are voltages or voltage signals. For example, the first and second control signals 164, 166 may be control voltages. Alternatively, the first and second control signals 164, 166 may be currents or current signals. For example, the first and second control signals 164, 166 may be control currents. In FIG. 1, the first and second control signals 164, 166 are analog signals. Alternatively, the first and second control signals 164, 166 may be digital signals.

In some examples, the first and second control signals 164, 166 cause the phase switching network 102 to operate in a first operation state by increasing a dead time between generating the first gate voltage 122 and generating the second gate voltage 130 to reduce and/or otherwise eliminate the first cross-conduction current 156. In some examples, the first and second control signals 164, 166 cause the phase switching network 102 to operate in a second operation state by reducing the dead time to increase an efficiency of the converter 104 (e.g., the converter 104 can switching at a higher frequency). In some examples, the phase switching network 102 alternately operates between the first operation state and the second operation state to reduce and/or otherwise optimize the dead time between power switching operations of the first and second switching transistors 110, 112 to improve and/or otherwise optimize the efficiency (e.g., the power efficiency, the switching efficiency, etc.) of the converter 104.

While an example manner of implementing the CCC circuit 132 is illustrated in FIG. 1, one or more of the elements, processes, and/or devices illustrated in FIG. 1 may be combined, divided, re-arranged, omitted, eliminated, and/or implemented in any other way. Further, the first fixed delay circuit 134, the second fixed delay circuit 140, the first controlled delay circuit 150, the second controlled delay circuit 152, the cross detector circuit 154, the control circuit 162, and/or, more generally, the example CCC circuit 132 of FIG. 1 may be implemented by hardware, software, firmware, and/or any combination of hardware, software, and/or firmware. Thus, for example, any of the first fixed delay circuit 134, the second fixed delay circuit 140, the first controlled delay circuit 150, the second controlled delay circuit 152, the cross detector circuit 154, the control circuit 162, and/or, more generally, the example CCC circuit 132 could be implemented by one or more analog or digital circuit(s), logic circuits, programmable processor(s), programmable controller(s), graphics processing unit(s) (GPU (s)), digital signal processor(s) (DSP(s)), application specific integrated circuit(s) (ASIC(s)), programmable logic device (s) (PLD(s)), and/or field programmable logic device(s) (FPLD(s)). When reading any of the apparatus or system claims of this patent to cover a purely software and/or firmware implementation, at least one of the first fixed delay circuit 134, the second fixed delay circuit 140, the first controlled delay circuit 150, the second controlled delay circuit 152, the cross detector circuit 154, and/or the control circuit 162 is/are hereby expressly defined to include a non-transitory computer readable storage device or storage disk such as a memory, a digital versatile disk (DVD), a compact disk (CD), a Blu-ray disk, etc., including the software and/or firmware. Further still, the example CCC circuit 132 of FIG. 1 may include one or more elements, processes, and/or devices in addition to, or instead of, those illustrated in FIG. 1, and/or may include more than one of any or all of the illustrated elements, processes, and devices. As used herein, the phrase "in communication," including variations thereof, encompasses direct communication and/or indirect communication through one or more intermediary components, and does not require direct physical (e.g., wired) communication and/or constant communication, but rather additionally includes selective communication at periodic intervals, scheduled intervals, aperiodic intervals, and/or one-time events.

Figure 2:
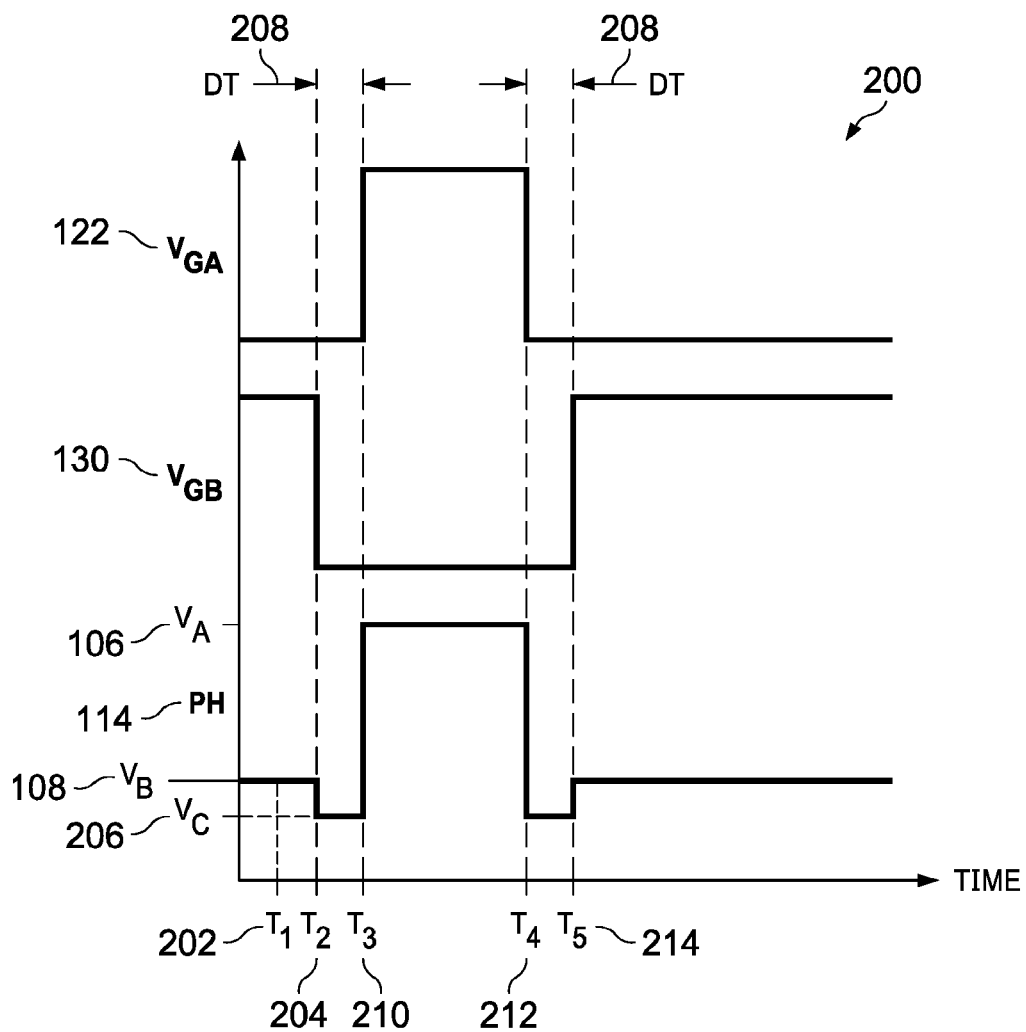
FIG. 2 depicts an example timing diagram corresponding to an operation of a typical power conversion system.

FIG. 2 depicts an example timing diagram 200 corresponding to an operation of a typical power conversion system. For example, the typical power conversion system may include the switching transistor network 107 of FIG. 1 without the CCC circuit 132 of FIG. 1. In FIG. 2, at a first time ($T_1$) 202, the first switching transistor 110 of FIG. 1 is disabled based on not applying the first gate voltage 122 to the first gate terminal 118. For example, a low signal may be applied to the first gate terminal 118. In FIG. 2, at the first time 202, the second switching transistor 112 of FIG. 1 is enabled based on the second gate voltage 130 being applied to the second gate terminal 126. For example, a high signal may be applied to the second gate terminal 126. In response to disabling the first switching transistor 110 and enabling the second switching transistor 112, the phase node 114 outputs the second voltage 108 to the converter 104 of FIG. 1.

In the illustrated example of FIG. 2, the second switching transistor 112 of FIG. 1 is disabled at a second time ($T_2$) 204. At the second time 204, the second switching transistor 112 turns off based on withdrawing the second gate voltage 130 from the second gate terminal 126. For example, a low signal may be applied to the second gate terminal 126. In response to the first switching transistor 110 being disabled and disabling the second switching transistor 112, the phase node 114 outputs a third voltage ($V_C$) 206 to the converter 104 of FIG. 1. In FIG. 2, the third voltage 206 is negative. For example, when the second switching transistor 112 transitions from being enabled to disabled, driving the second gate terminal 126 from a high voltage (e.g., the second gate voltage 130) to 0 volts allows a current in an inductor included in the converter 104 of FIG. 1 to circulate by turning on the second diode 129 of FIG. 1, thereby causing the second drain terminal 124 to drop to a negative voltage.

In FIG. 2, the first and second switching transistors 110, 112 of FIG. 1 remain disabled for a dead time (DT) 208 that begins at the second time 204 and ends at a third time ($T_3$) 210. At the third time 210, the first switching transistor 110 transitions from disabled to enabled when the first gate voltage 122 is applied to the first gate terminal 118. At the third time 210, the phase node 114 outputs the first voltage 106 to the converter 104 of FIG. 1.

In the timing diagram 200 of FIG. 2, the first switching transistor 110 transitions from enabled to disabled at a fourth time ($T_4$) 212. In response to disabling the first switching transistor 110, the phase node 114 outputs the third voltage 206 to the converter 104 of FIG. 1. The phase node 114 outputs the third voltage 206 for the dead time 208 that begins at the fourth time 214 and ends at a fifth time ($T_5$) 214.

In FIG. 2, typical switching networks not including the CCC circuit 132 of FIG. 1 generate the dead time 208 designed for the worst-case timing (e.g., a maximum dead time) to ensure that there is no overlap between power switching operations of the first and second switching transistors 110, 112 of FIG. 1. By designing the dead time 208 based on the worst-case timing, the dead time 208 results in too large of a time delay (e.g., spanning multiple clock cycles) and reducing the efficiency of the converter 104 of FIG. 1. Examples described herein can adaptively reduce the dead time 208 based on the first cross-conduction current 156 of FIG. 1 and, thus, increase the efficiency of the converter 104.

Figure 3:
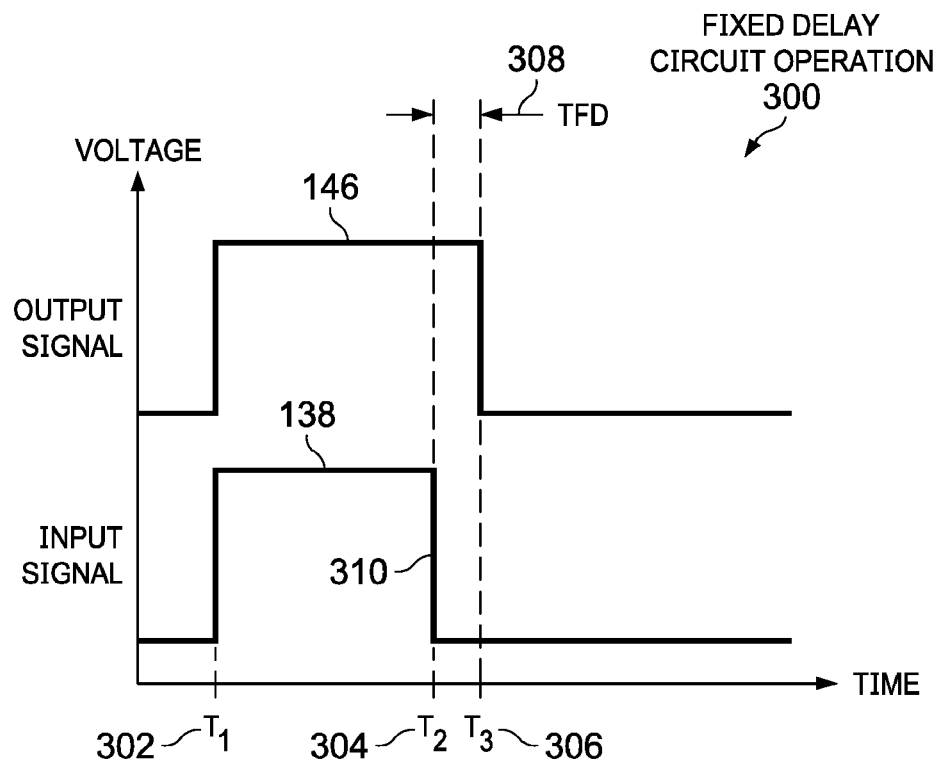
FIG. 3 depicts an example timing diagram corresponding to an operation of an example fixed delay circuit included in the phase switching network of FIG. 1.

FIG. 3 depicts an example timing diagram 300 corresponding to an operation of the first fixed delay circuit 134 included in the phase switching network 102 of FIG. 1. Alternatively, the timing diagram 300 of FIG. 3 may correspond to an operation of the second fixed delay circuit 140 of FIG. 1. In FIG. 3, at a first time ($T_1$) 302, the first fixed delay circuit 134 obtains the first input signal 138 and outputs the first fixed delay signal 146. At a second time ($T_2$) 304, the first fixed delay circuit 134 stops receiving the first input signal 138 and continues to output the first fixed delay signal 146 until a third time ($T_3$) 306. In FIG. 3, a time difference between the second time 304 and the third time 306 is a fixed delay 308, or a time fall delay (TFD) 308. In FIG. 3, the TFD 308 is a fixed time delay applied to a falling edge 310 of the first input signal 138 by the first fixed delay circuit 134.

Figure 4:
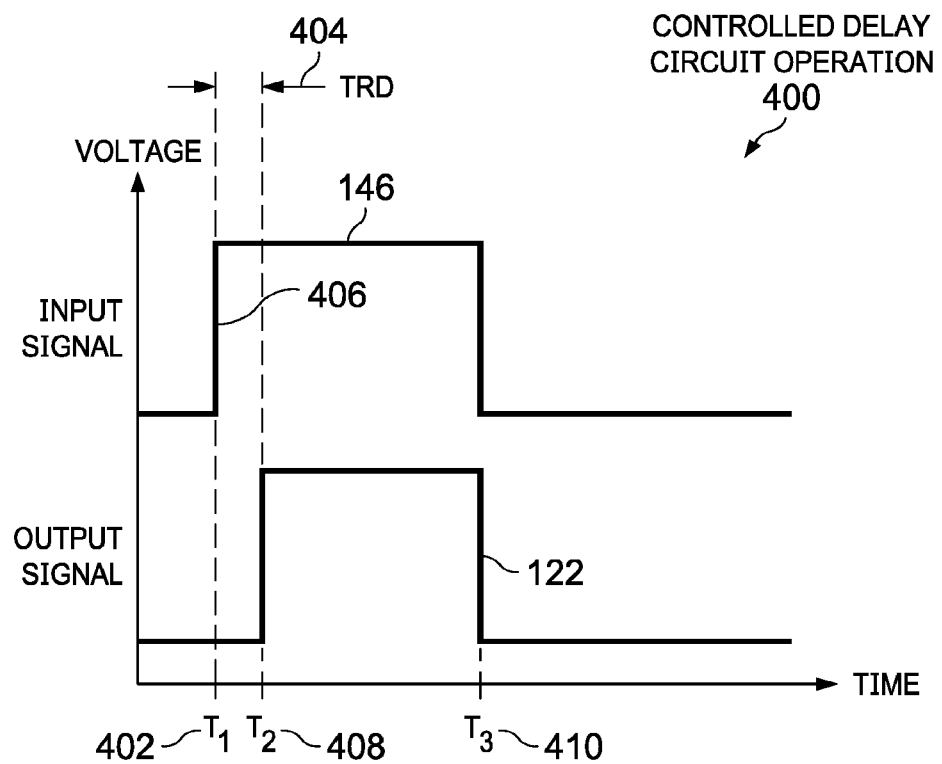
FIG. 4 depicts an example timing diagram corresponding to an operation of an example controlled delay circuit included in the phase switching network of FIG. 1.

FIG. 4 depicts an example timing diagram 400 corresponding to an operation of the first controlled delay circuit 150 included in the phase switching network 102 of FIG. 1. Alternatively, the timing diagram 400 of FIG. 4 may correspond to an operation of the second controlled delay circuit 152 of FIG. 1. In FIG. 4, at a first time ($T_1$) 402, the first controlled delay circuit 150 obtains the first fixed delay signal 146. In FIG. 4, the first controlled delay circuit 150 applies a controlled delay 404 (e.g., an adaptive delay), or a time rise delay (TRD) 404 to a rising edge 406 of the first fixed delay signal 146.

In FIG. 4, the TRD 404 begins at the first time 402 and ends at a second time ($T_2$) 408, at which the first controlled delay circuit 150 outputs the first gate voltage 122 to the first switching transistor 110 of FIG. 1. In FIG. 4, the first controlled delay circuit 150 stops receiving the first fixed delay signal 146 at a third time ($T_3$) 410, at which the first controlled delay circuit 150 stops outputting the first gate voltage 122 to the first switching transistor 110.

In FIG. 4, the TRD 404 corresponds to an adaptive time delay based on the first control signal 164 obtained from the control circuit 162 of FIG. 1. For example, the first controlled delay circuit 150 may generate a different TRD than the TRD 404 depicted in FIG. 4 in a subsequent clock cycle during which the control circuit 162 may generate a different control signal than the first control signal 164 of FIG. 1.

Figure 5:
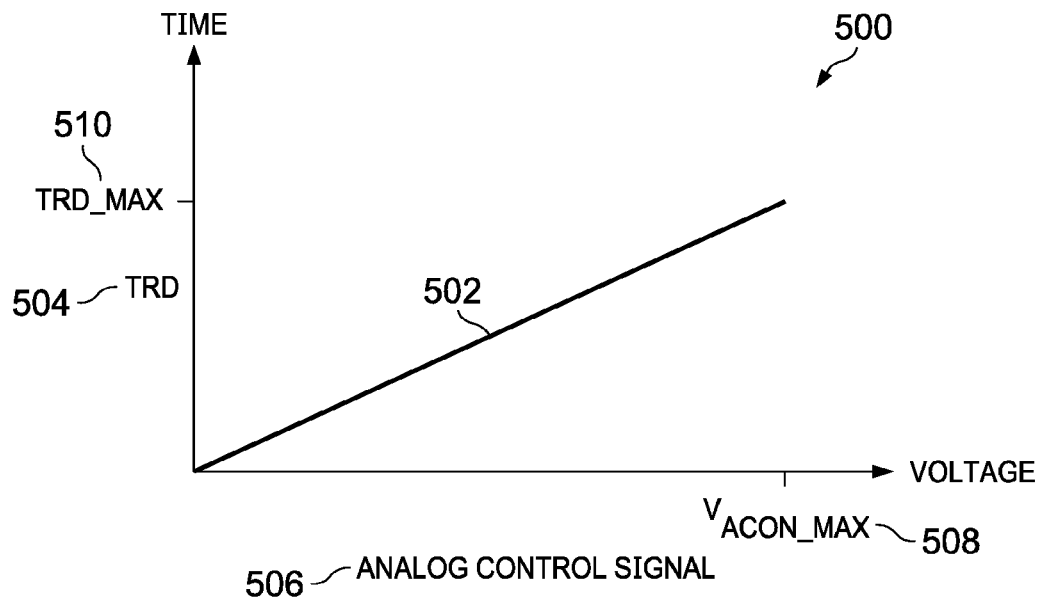
FIG. 5 illustrates an example graph depicting a time rise delay as a function of an example analog control signal corresponding to the operation of an example controlled delay circuit included in the phase switching network of FIG. 1.

FIG. 5 illustrates an example graph 500 depicting a first example TRD function 502 that outputs an example TRD 504 as a function of an example analog control signal 506 corresponding to an example operation of the CCC circuit 132 of FIG. 1. For example, the first controlled delay circuit 150 may map the analog control signal 506 to the TRD 504 and generate the first gate voltage 122 based on the mapping. In another example, the second controlled delay circuit 152 may map the analog control signal 506 to the TRD 504 and generate the second gate voltage 130 based on the mapping.

In FIG. 5, the first TRD function 502 is a linear function. Alternatively, the first TRD function 502 may be a quadratic function, an exponential function, etc. In FIG. 5, the TRD 504 is a TRD applied by one or both controlled delay circuits 150, 152 of FIG. 1. For example, the TRD 504 may correspond to a TRD applied by the first controlled delay circuit 150 of FIG. 1 to a rising edge of the first fixed delay signal 146.

In FIG. 5, the analog control signal 506 corresponds to an output of the control circuit 162 of FIG. 1. For example, the analog control signal 506 may correspond to one or both of the first and second control signals 164, 166 of FIG. 1 to cause a delay in a rising edge of one or both of the first and second gate voltages 122, 130 of FIG. 1. In FIG. 5, the analog control signal 506 is a voltage. Alternatively, the analog control signal 506 may be a current.

In FIG. 5, the analog control signal 506 is defined by a maximum analog control voltage ($V_{ACON\_}$MAX) 508. For example, the control circuit 162 may not generate an output greater than the maximum analog control voltage 508. For example, the first control signal 164 may not exceed the maximum analog control voltage 508.

In FIG. 5, the TRD 504 is defined by a maximum TRD (TRD_MAX) 510. For example, the first controlled delay circuit 150 may not delay the rising edge 406 of the first fixed delay signal 146 by more than the maximum TRD 510. For example, the maximum TRD 510 may correspond to a maximum TRD to which the rising edge 406 of the first fixed delay signal 146 can be delayed.

Figure 6:
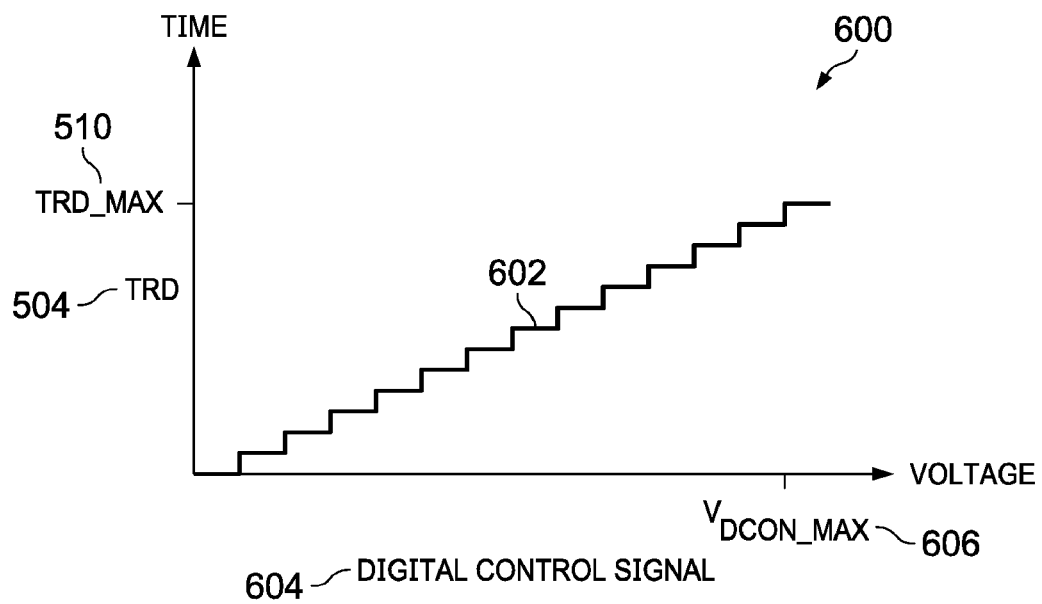
FIG. 6 illustrates an example graph depicting a time rise delay as a function of an example digital control signal corresponding to the operation of an example controlled delay circuit included in the phase switching network of FIG. 1.

FIG. 6 illustrates an example graph 600 depicting a second example TRD function 602 that outputs the example TRD 504 as a function of an example digital control signal 604 corresponding to an example operation of the CCC circuit 132 of FIG. 1. For example, the first controlled delay circuit 150 may map the digital control signal 604 to the TRD 504 and generate the first gate voltage 122 based on the mapping. In another example, the second controlled delay circuit 152 may map the digital control signal 604 to the TRD 504 and generate the second gate voltage 130 based on the mapping.

In FIG. 6, the second TRD function 602 is a linear step function. Alternatively, the second TRD function 602 may be a quadratic step function, an exponential step function, etc. In FIG. 6, the digital control signal 604 corresponds to an output of the control circuit 162 of FIG. 1. For example, the digital control signal 604 may correspond to one or both of the first and second control signals 164, 166 of FIG. 1 to delay a rising edge of one or both of the first and second gate voltages 122, 130 of FIG. 1. In FIG. 6, the digital control signal 604 is a voltage. Alternatively, the digital control signal 604 may be a current.

In FIG. 6, the digital control signal 604 is defined by a maximum digital control voltage ($V_{DCON\_}$MAX) 606. For example, the control circuit 162 may not generate an output greater than the maximum digital control voltage 606. For example, the first control signal 164 may not exceed the maximum digital control voltage 606.

In FIG. 6, the TRD 504 is defined by a maximum TRD (TRD_MAX) 510. For example, the first controlled delay circuit 150 may not delay the rising edge 406 of the first fixed delay signal 146 by more than the maximum TRD 510. For example, the maximum TRD 510 may correspond to a maximum TRD to which the rising edge 406 of the first fixed delay signal 146 can be delayed.

Figure 7:
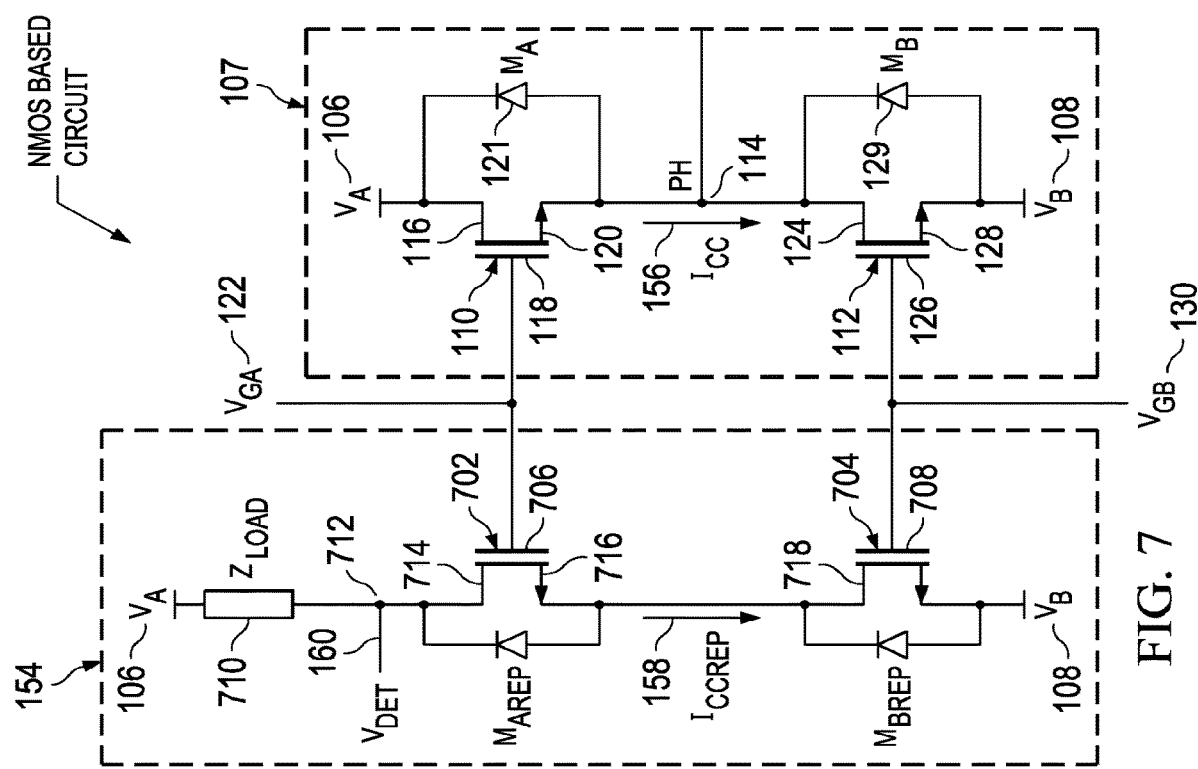
FIG. 7 is a schematic illustration of an example cross detector circuit included in the phase switching network of FIG. 1 implemented utilizing N-Channel MOSFETs.

FIG. 7 is a schematic illustration of the cross detector circuit 154 of FIG. 1 implemented with N-Channel MOSFETs. For example, the cross detector circuit 154 is based on NMOS transistors. In FIG. 7, the cross detector circuit 154 includes a first example cross detector transistor ($M_{AREP}$) 702 and a second example cross detector transistor ($M_{BREP}$) 704. In FIG. 7, the first and second cross detector transistors 702, 704 are transistors such as N-Channel MOSFETs. In FIG. 7, the first and second cross detector transistors 702, 704 are replicas of the first and second switching transistors 110, 112 of FIG. 1. For example, the first cross detector transistor 702 is substantially similar and/or otherwise identical to the first switching transistor 110 of FIG. 1. In another example, the second cross detector transistor 704 is substantially similar and/or otherwise identical to the second switching transistor 112 of FIG. 1.

In FIG. 7, the first gate voltage 122 of FIG. 1 is applied to the first gate terminal 118 and a first cross detector gate terminal 706 of the first cross detector transistor 702. Therefore, the first cross detector transistor 702 is enabled when the first switching transistor 110 of FIG. 1 is enabled. Conversely, the first cross detector transistor 702 is disabled when the first switching transistor 110 is disabled.

In FIG. 7, the second gate voltage 130 is applied to the second gate terminal 126 and a second cross detector gate terminal 708 of the second cross detector transistor 704. Therefore, the second cross detector transistor 704 is enabled when the second switching transistor 112 of FIG. 1 is enabled. Conversely, the second cross detector transistor 704 is disabled when the second switching transistor 112 is disabled.

In FIG. 7, if cross conduction occurs between the first and second switching transistors 110, 112, then cross conduction also occurs between the first and second cross detector transistors 702, 704. For example, if the first and second switching transistors 110, 112 are simultaneously enabled, the first cross-conduction current 156 flows through the first and second switching transistors 110, 112. In such an example, the first and second cross detector transistors 702, 704 are simultaneously enabled when the first and second switching transistors 110, 112 are enabled, thereby causing the second cross-conduction current 158 to flow through the first and second cross detector transistors 702, 704.

In FIG. 7, the second cross-conduction current 158 is proportional or scaled to the first cross-conduction current 156 based on a load ($Z_{LOAD}$) 710. In FIG. 7, the load 710 is coupled to the first voltage 106 and the first cross detector transistor 702 at a cross conduction measurement node 712. In FIG. 7, the load 710 is a resistor. Alternatively, the load 710 may be a current source. In FIG. 7, a resistance of the load 710 is determined to scale the second cross-conduction current 158. In some examples, the resistance of the load 710 is adjusted to modify a measurement sensitivity of the control circuit 162 of FIG. 1.

In FIG. 7, the cross detector circuit 154 generates the cross-conduction voltage 160 of FIG. 1 when the first and second cross detector transistors 702, 704 are simultaneously enabled causing the second cross-conduction current 158 to flow through the load 710. For example, the cross-conduction voltage 160 corresponds and/or is otherwise based on a voltage across the load 710 when the second cross-conduction current 158 flows through the load 710. In response to the load 710 generating the cross-conduction voltage 160, the control circuit 162 of FIG. 1 generates the first and/or the second control signals 164, 166 of FIG. 1 based on the cross-conduction voltage 160.

In the illustrated example of FIG. 7, a third example drain 714 of the first cross detector transistor 706 is coupled to the load 710 and the control circuit 162 at the cross conduction measurement node 712. In FIG. 7, a third example source 716 of the first cross detector transistor 706 is coupled to a fourth example drain 718 of the second cross detector transistor 704. In FIG. 7, the first cross detector gate terminal 706 of the first cross detector transistor 702 is coupled to the first gate terminal 118 of the first switching transistor 110 and the first controlled delay circuit 150 of FIG. 1. In FIG. 7, the second cross detector gate terminal 708 of the second cross detector transistor 706 is coupled to the second gate terminal 126 of the second switching transistor 112 and the second controlled delay circuit 152 of FIG. 1. In FIG. 7, the first source 120 of the first switching transistor 110 is coupled to the second drain 120 of the second switching transistor 112 at the phase node 114.

Figure 8:
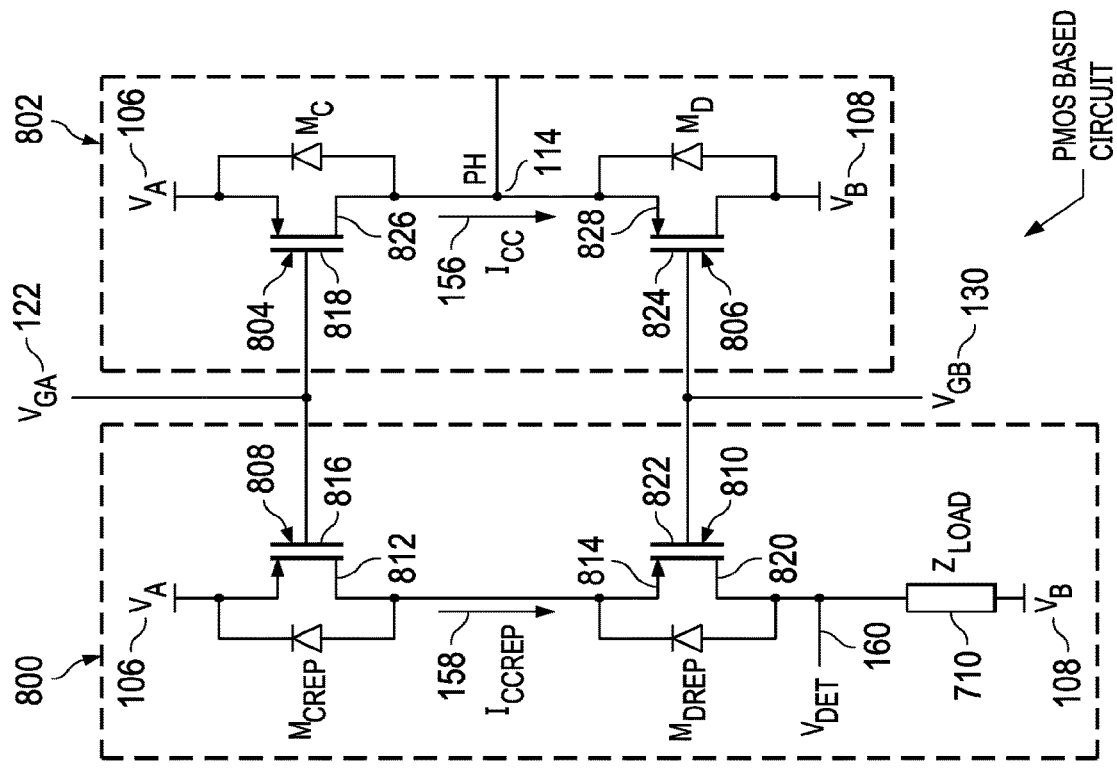
FIG. 8 is a schematic illustration of an example cross detector circuit included in the phase switching network of FIG. 1 implemented utilizing P-Channel MOSFETs.

FIG. 8 is a schematic illustration of a second example cross detector circuit 800 implemented with P-Channel MOSFETs. In FIG. 8, the second cross detector circuit 800 is coupled to a second example transistor switching network 802 that includes a third example switching transistor ($M_C$) 804 coupled to a fourth example switching transistor ($M_D$) 806. In FIG. 8, the third and fourth switching transistors 804, 806 are transistors such as P-Channel MOSFETs. In FIG. 8, the third and fourth switching transistors 804, 806 are coupled to the phase node 114 of FIG. 1 to alternately provide the first voltage 106 or the second voltage 108 to the phase node 114 via one or more power switching operations of the third and fourth switching transistors 804, 806.

In FIG. 8, the second cross detector circuit 800 includes a third example cross detector transistor ($M_{CREF}$) 808 and a fourth example cross detector transistor ($M_{DREF}$) 810. In FIG. 8, the third and fourth cross detector transistors 808, 810 are P-Channel MOSFETs. For example, the second cross detector circuit 800 is based on PMOS transistors. In FIG. 8, the third and fourth cross detector transistors 808, 810 are replicas of the third and fourth switching transistors 804, 806. For example, the third cross detector transistor 808 is substantially similar and/or otherwise identical to the third switching transistor 804. In another example, the fourth cross detector transistor 810 is substantially similar and/or otherwise identical to the fourth cross detector transistor 806.

In FIG. 8, if cross conduction occurs between the third and fourth switching transistors 804, 806, then cross conduction also occurs between the third and fourth cross detector transistors 808, 810. For example, if the third and fourth switching transistors 804, 806 are simultaneously enabled, the first cross-conduction current 156 flows through the third and fourth switching transistors 804, 806. In such an example, the third and fourth cross detector transistors 808, 810 are simultaneously enabled when the third and fourth switching transistors 804, 806 are enabled, causing the second cross-conduction current 158 to flow through the third and fourth cross detector transistors 808, 810.

In FIG. 8, the cross detector circuit 154 generates the cross-conduction voltage 160 of FIG. 1 when the third and fourth cross detector transistors 808, 810 are simultaneously enabled causing the second cross-conduction current 158 to flow through the load 710. In response to the load 710 generating the cross-conduction voltage 160, the control circuit 162 of FIG. 1 generates the first and/or the second control signals 164, 166 of FIG. 1 based on the cross-conduction voltage 160.

In the illustrated example of FIG. 8, a fifth example drain 812 of the third cross detector transistor 808 is coupled to a fourth example source 814 of the fourth cross detector transistor 810. In FIG. 8, a third example cross detector gate 816 of the third cross detector transistor 808 is coupled to a third example gate 818 of the first cross detector transistor 804 and the first controlled delay circuit 150 of FIG. 1. In FIG. 8, a sixth example drain 820 of the fourth cross detector transistor 810 is coupled to the load 710 and the control circuit 162 of FIG. 1. In FIG. 8, a fourth example cross detector gate 822 of the fourth cross detector transistor 810 is coupled to fourth example gate 824 of the second cross detector transistor 806 and the second controlled delay circuit 152 of FIG. 1. In FIG. 8, a seventh example drain 826 of the first cross detector transistor 804 is coupled to a fifth example source 828 of the second cross detector transistor 806 at the phase node 114.

Figure 9:
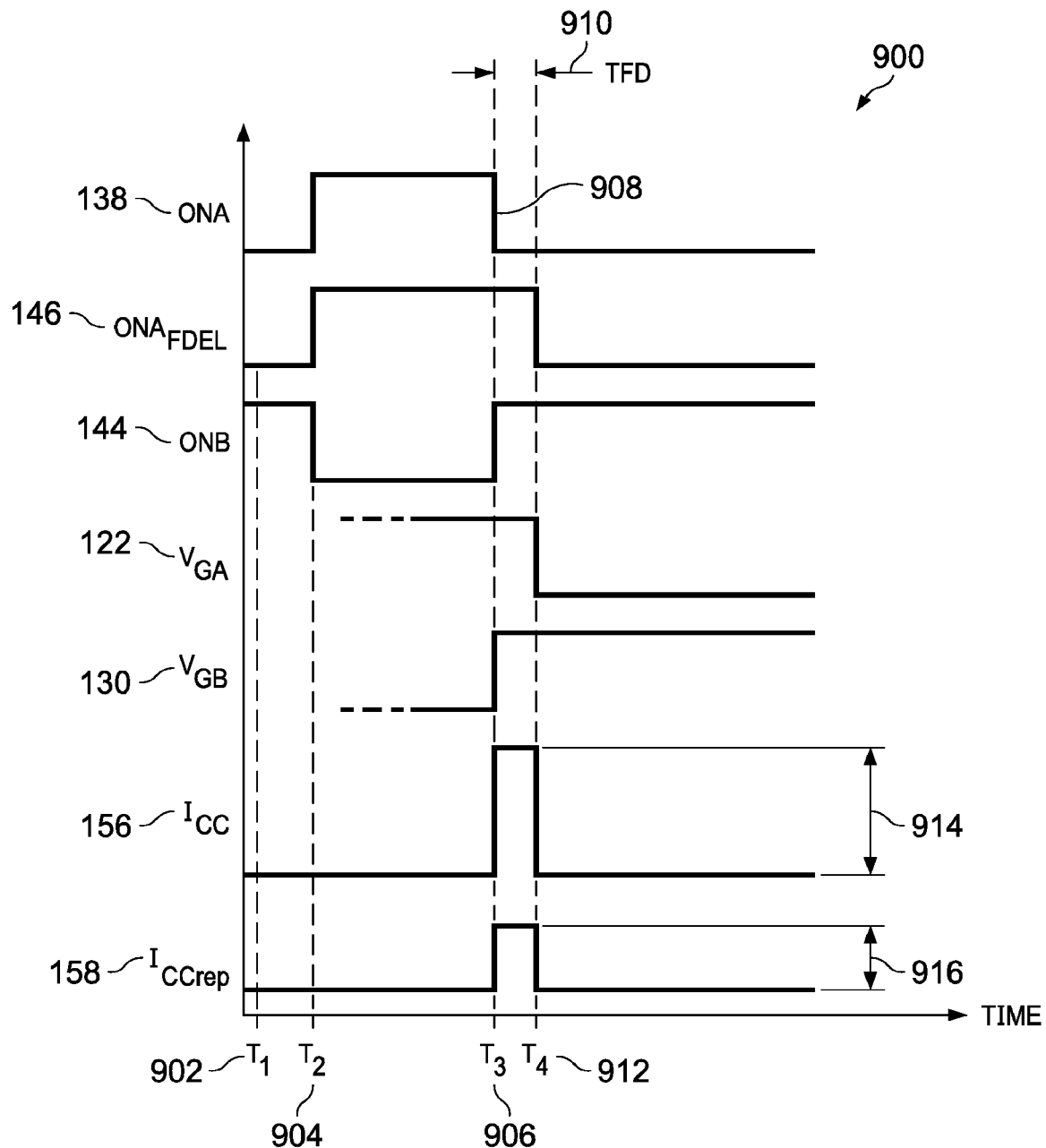
FIG. 9 depicts an example timing diagram corresponding to an operation of the phase switching network of FIG. 1.

FIG. 9 depicts an example timing diagram 900 corresponding to an operation of the phase switching network 102 of FIG. 1. In FIG. 9, at a first time ($T_1$) 902, the second switching transistor 112 of FIG. 1 is enabled based on the second input signal 144 being a high signal causing the second gate voltage 130 to be a high signal. In FIG. 9, the second switching transistor 112 transitions from enabled to disabled at a second time ($T_2$) 904 when the second input signal 144 transitions from high to low. At the second time 904, the first input signal 138 transitions from low to high causing the first switching transistor 110 of FIG. 1 to transition from disabled to enabled.

In FIG. 9, the first input signal 138 transitions from high to low and the second input signal 144 transitions from low to high at a third time ($T_3$) 906. At the third time 906, the second switching transistor 112 transitions from disabled to enabled when the second gate voltage 130 transitions from low to high. At the third time 906, the first switching transistor 110 is enabled when the second switching transistor 112 is enabled. The first switching transistor 110 is enabled because the first gate voltage 122 is high because the first fixed delay circuit 134 delayed a falling edge 908 of the first input signal 138 by a TFD 910. In FIG. 9, the first fixed delay signal ($ONA_{FDEL}$) 146 remains high until a fourth time ($T_4$) 912, at which the first fixed delay signal 146 transitions from high to low. At the fourth time 912, the first switching transistor 110 transitions from enabled to disabled.

In FIG. 9, the first and second switching transistors 110, 112 of FIG. 1 are enabled simultaneously for a time period beginning at the third time 906 and ending at the fourth time 912, which corresponds to the TFD 910. In FIG. 9, the TFD 910 corresponds to a cross conduction time during which the first cross-conduction current 156 flows through the first and second switching transistors 110, 112. In FIG. 9, the second cross-conduction current 158 flows through the first and second cross detector transistors 702, 704 of FIG. 7 for the same amount of time as the first cross-conduction current 156 (e.g., the TFD 910, the cross conduction time, etc.). In FIG. 9, the first and second cross-conduction currents 156, 158 dissipate when the first switching transistor 110 transitions from enabled to disabled based on the first fixed delay signal 146 and the corresponding first gate voltage 122 transitioning from high to low.

In FIG. 9, a first value 914 of the first cross-conduction current 156 is greater than a second value 916 of the second cross-conduction current 158. In FIG. 9, the first value 914 is a scaled value of the second value 916. For example, the first value 914 is a scaled value of the second value 916 based on the load 710 of FIG. 7 (e.g., a resistance of the load 710, a current source value of the load 710, etc.). A change in the load 710 such as a modifying the resistance of the load 710 modifies a value of the second cross-conduction current 158.

Figure 10:
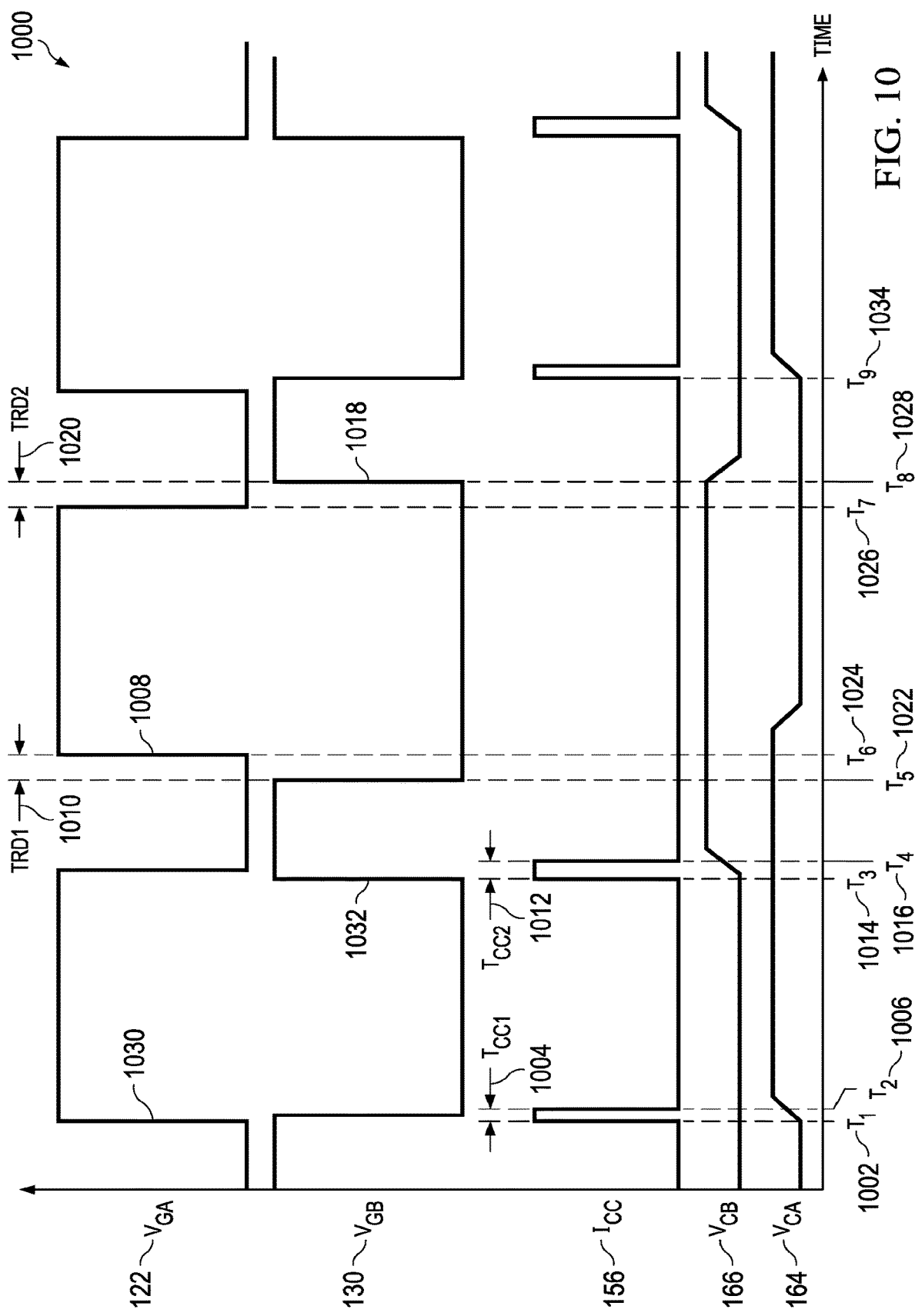
FIG. 10 depicts an example timing diagram corresponding to the phase switching network of FIG. 1 operating for a plurality of power switching operations.

FIG. 10 depicts an example timing diagram 1000 corresponding to the phase switching network 102 of FIG. 1 operating for a plurality of power switching operations. In FIG. 10, at a first time ($T_1$) 1002, the first switching transistor 110 of FIG. 1 transitions from disabled to enabled based on the first gate voltage 122 transitioning from low to high. At the first time 1002, the second switching transistor 112 of FIG. 1 is enabled. The first and second switching transistors 110, 112 are enabled simultaneously during a first cross conduction time ($T_{CC1}$) 1004 beginning at the first time 1002 until a second time 1006, at which the second gate voltage 130 transitions from high to low turning off the second switching transistor 112.

During the first cross conduction time 1004, the cross detector circuit 154 of FIG. 1 generates and transmits a first value of the cross-conduction voltage 160 to the control circuit 162 of FIG. 1. In response to receiving the first value of the cross-conduction voltage 160, the control circuit 162 generates and transmits the first control signal 164 to the first controlled delay circuit 150 of FIG. 1. In response to receiving the first control signal 164, the first controlled delay circuit 150 delays a first rising edge 1008 of the first gate voltage 122 for a first TRD (TRD1) 1010 based on the first TRD function 502 of FIG. 5 or the second TRD function 602 of FIG. 6.

In the timing diagram 1000 of FIG. 10, the first and second switching transistors 110, 112 are enabled simultaneously during a second cross conduction time ($T_{CC2}$) 1012 beginning at a third time ($T_3$) 1014 and ending at a fourth time ($T_4$) 1016. During the second cross conduction time 1012, the cross detector circuit 154 of FIG. 1 generates and transmits a second value of the cross-conduction voltage 160 to the control circuit 162 of FIG. 1, where the second value is different from the first value. In response to receiving the second value of the cross-conduction voltage 160, the control circuit 162 generates and transmits the second control signal 166 to the second controlled delay circuit 152 of FIG. 1. In response to receiving the second control signal 166, the second controlled delay circuit 152 delays a second rising edge 1018 of the second gate voltage 130 for a second TRD 1020 based on the first TRD function 502 of FIG. 5 or the second TRD function 602 of FIG. 6.

In FIG. 10, in response to delaying the first rising edge 1008 by the first TRD 1010, a transition of the first switching transistor 110 from disabled to enabled is delayed from a fifth time ($T_5$) 1022 until a sixth time 1024, at which the second switching transistor 112 transitions from enabled to disabled. By delaying the transition of the first switching transistor 110 from the fifth time 1022 until the sixth time 1024, cross conduction does not occur and prevents the first cross-conduction current 156 from flowing through the first and second switching transistors 110, 112.

In FIG. 10, in response to delaying the second rising edge 1018 by the second TRD 1020, a transition of the second switching transistor 112 from disabled to enabled is delayed from a seventh time ($T_7$) 1026 until an eighth time ($T_8$) 1028, where the first switching transistor 110 transitions from enabled to disabled at the seventh time 1026. By delaying the transition of the second switching transistor 112 from the seventh time 1026 until the eighth time 1028, cross conduction does not occur and prevents the first cross-conduction current 156 from flowing through the first and second switching transistors 110, 112.

In the timing diagram 1000 of FIG. 10, the control circuit 162 generates the first control signal 164 when a rising edge of the first gate voltage 122 causes cross conduction. For example, a third rising edge 1030 of the first gate voltage 122 led to the first cross-conduction current 156 flowing through the first and second switching transistors 110, 112 during the first cross conduction time 1004. In response to the third rising edge 1030 causing the first cross conduction time 1004, the control circuit 162 generates the first control signal 164 from the first time 1002 until approximately the sixth time 1024. The control circuit 162 continues to generate the first control signal 164 until a rising edge of the first gate voltage 122 does not cause cross conduction. For example, the control circuit 162 stops generating the first control signal 164 at approximately the sixth time 1024 because the first rising edge 1008 of the first gate voltage 122 did not cause cross conduction.

In the timing diagram 1000 of FIG. 10, the control circuit 162 generates the second control signal 166 when a rising edge of the second gate voltage 130 causes cross conduction. For example, a fourth rising edge 1032 of the second gate voltage 130 led to the first cross-conduction current 156 flowing through the first and second switching transistors 110, 112 during the second cross conduction time 1012. In response to the fourth rising edge 1032 causing the second cross conduction time 1012, the control circuit 162 generates the second control signal 166 from the third time 1014 until approximately the seventh time 1026. The control circuit 162 continues to generate the second control signal 166 until a rising edge of the second gate voltage 130 does not cause cross conduction. For example, the control circuit 162 stops generating the second control signal 166 at approximately the seventh time 1026 because the second rising edge 1018 of the second gate voltage 130 did not cause cross conduction.

In FIG. 10, the control circuit 162 reduces (e.g., iteratively reduces) the first TRD 1010 and the second TRD 1020 every clock cycle until cross conduction occurs. In FIG. 10, the control circuit 162 reduces (e.g., iteratively reduce) the first TRD 1010 until a ninth time ($T_9$) 1034 where the first cross-conduction current 156 is flowing through the first and second switching transistors 110, 112. At the ninth time 1034, the cross detector circuit 154 detects the second cross-conduction current 158. At the ninth time, 1034, in response to detecting the second cross-conduction current 158, the cross detector circuit 154 generates and transmits the cross-conduction voltage 160 to the control circuit 162. In response to receiving the cross-conduction voltage 160, the control circuit 162 generates the first control signal 164 at the ninth time 1034 to prevent cross conduction occurring in a subsequent clock cycle. As depicted in FIG. 10, the phase switching network 102 of FIG. 1 operates between a first state (e.g., a first operation state) of no cross conduction occurring and a second state (e.g., a second operation state) of negligible cross conduction occurring to reduce and/or otherwise optimize a dead time between power switching operations of the first and second switching transistors 110, 112.

Figure 11:
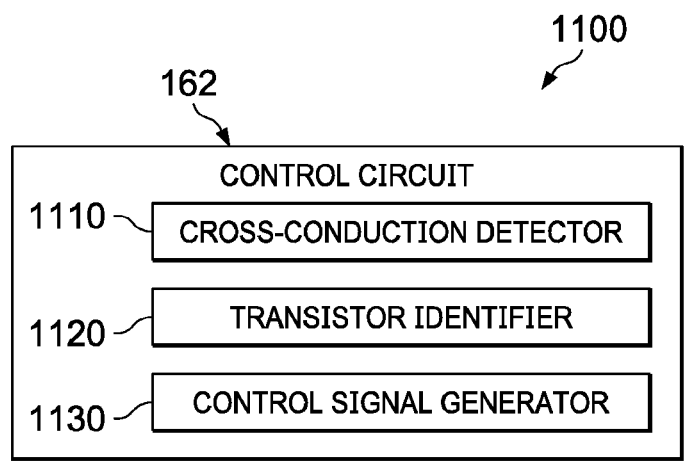
FIG. 11 depicts a block diagram of an example implementation of an example control circuit included in the phase switching network of FIG. 1.

FIG. 11 depicts a block diagram of an example implementation of the control circuit 162 of FIG. 1 to generate the first and second control signals 164, 166 of FIG. 1 based on the cross-conduction voltage 160 of FIG. 1. In FIG. 11, the control circuit 162 includes an example cross-conduction detector 1110, an example transistor identifier 1120, and an example control signal generator 1130.

In the illustrated example of FIG. 11, the control circuit 162 includes the cross-conduction detector 1110 to determine when cross conduction occurs. For example, the cross-conduction detector 1110 may determine that the first cross-conduction current 156 is flowing through the first and second switching transistors 110, 112 of FIG. 1 based on the second cross-conduction current 158 flowing through the first and second cross detector transistors 702, 704 of FIG. 7.

In some examples, the cross-conduction detector 1110 determines that cross conduction is occurring based on receiving the cross-conduction voltage 160 from the cross detector circuit 154 of FIG. 1. For example, the cross-conduction detector 1110 may determine that cross conduction is not occurring based on determining that the cross-conduction voltage 160 is negligible (e.g., approximately 0 volts). In another example, the cross-conduction detector 1110 may determine that cross conduction is occurring based on determining that the cross-conduction voltage 160 satisfies a cross conduction threshold (e.g., 0.1 volts, 0.5 volts, 2 volts, etc.). For example, the cross-conduction detector 1110 may compare the cross-conduction voltage 160 to the cross conduction threshold and determine that the cross-conduction voltage 160 satisfies the cross conduction threshold based on the cross-conduction voltage 160 being greater than the cross conduction threshold. In response to determining that the cross conduction threshold has been satisfied, the cross-conduction detector 1110 may determine that cross conduction is occurring based on the comparison.

In the illustrated example of FIG. 11, the control circuit 162 includes the transistor identifier 1120 to identify a transistor that triggered and/or otherwise caused cross conduction. In some examples, the transistor identifier 1120 identifies the first switching transistor 110 of FIG. 1 as triggering cross conduction based on a rising edge of the first gate voltage 122 coinciding with the cross conduction. For example, the transistor identifier 1120 may identify the first switching transistor 110 as triggering cross conduction based on the cross detector circuit 154 generating the cross-conduction voltage 160 at the first time 1002 of FIG. 10 substantially simultaneously with the third rising edge 1030 of FIG. 10.

In some examples, the transistor identifier 1120 identifies the second switching transistor 112 of FIG. 1 as triggering cross conduction based on a rising edge of the second gate voltage 130 coinciding with the cross conduction. For example, the transistor identifier 1120 may identify the second switching transistor 112 as triggering cross conduction based on the first cross-conduction current 156 occurring at the third time 1014 of FIG. 10 substantially simultaneously with the fourth rising edge 1032 of FIG. 10.

In the illustrated example of FIG. 11, the control circuit 162 includes the control signal generator 1130 to generate the first and second control signals 164, 166 of FIG. 1 based on the cross-conduction voltage 160. In some examples, the control signal generator 1130 generates the first control signal 164 to delay a rising edge of the first gate voltage 122. For example, the control signal generator 1130 may generate and transmit the first control signal 164 to the first controlled delay circuit 150 to delay the rising edge of the first gate voltage 122 by a TRD based on the first TRD function 502 of FIG. 5 or the second TRD function 602 of FIG. 6. For example, the first controlled delay circuit 150 may map the first control signal 164 to the TRD 504 of FIG. 5.

In some examples, the control signal generator 1130 generates the second control signal 166 to delay a rising edge of the second gate voltage 130. For example, the control signal generator 1130 may generate and transmit the second control signal 166 to the second controlled delay circuit 152 to delay the rising edge of the second gate voltage 130 by a TRD based on the first TRD function 502 of FIG. 5 or the second TRD function 602 of FIG. 6. For example, the second controlled delay circuit 150 may map the second control signal 164 to the TRD 504 of FIG. 5.

While an example manner of implementing the control circuit 162 of FIG. 1 is illustrated in FIG. 11, one or more of the elements, processes, and/or devices illustrated in FIG. 11 may be combined, divided, re-arranged, omitted, eliminated, and/or implemented in any other way. Further, the example cross-conduction detector 1110, the example transistor identifier 1120, the example control signal generator 1130 and/or, more generally, the example control circuit 162 of FIG. 11 may be implemented by hardware, software, firmware, and/or any combination of hardware, software, and/or firmware. Thus, for example, any of the example cross-conduction detector 1110, the example transistor identifier 1120, the example control signal generator 1130, and/or, more generally, the example control circuit 162 could be implemented by one or more analog or digital circuit(s), logic circuits, programmable processor(s), programmable controller(s), graphics processing unit(s) (GPU (s)), digital signal processor(s) (DSP(s)), application specific integrated circuit(s) (ASIC(s)), programmable logic device (s) (PLD(s)), and/or field programmable logic device(s) (FPLD(s)). When reading any of the apparatus or system claims of this patent to cover a purely software and/or firmware implementation, at least one of the example cross-conduction detector 1110, the example transistor identifier 1120, and/or the example control signal generator 1130 is/are hereby expressly defined to include a non-transitory computer readable storage device or storage disk such as a memory, a digital versatile disk (DVD), a compact disk (CD), a Blu-ray disk, etc., including the software and/or firmware. Further still, the example control circuit 162 of FIG. 1 may include one or more elements, processes, and/or devices in addition to, or instead of, those illustrated in FIG. 11, and/or may include more than one of any or all of the illustrated elements, processes, and devices.

Figure 12:
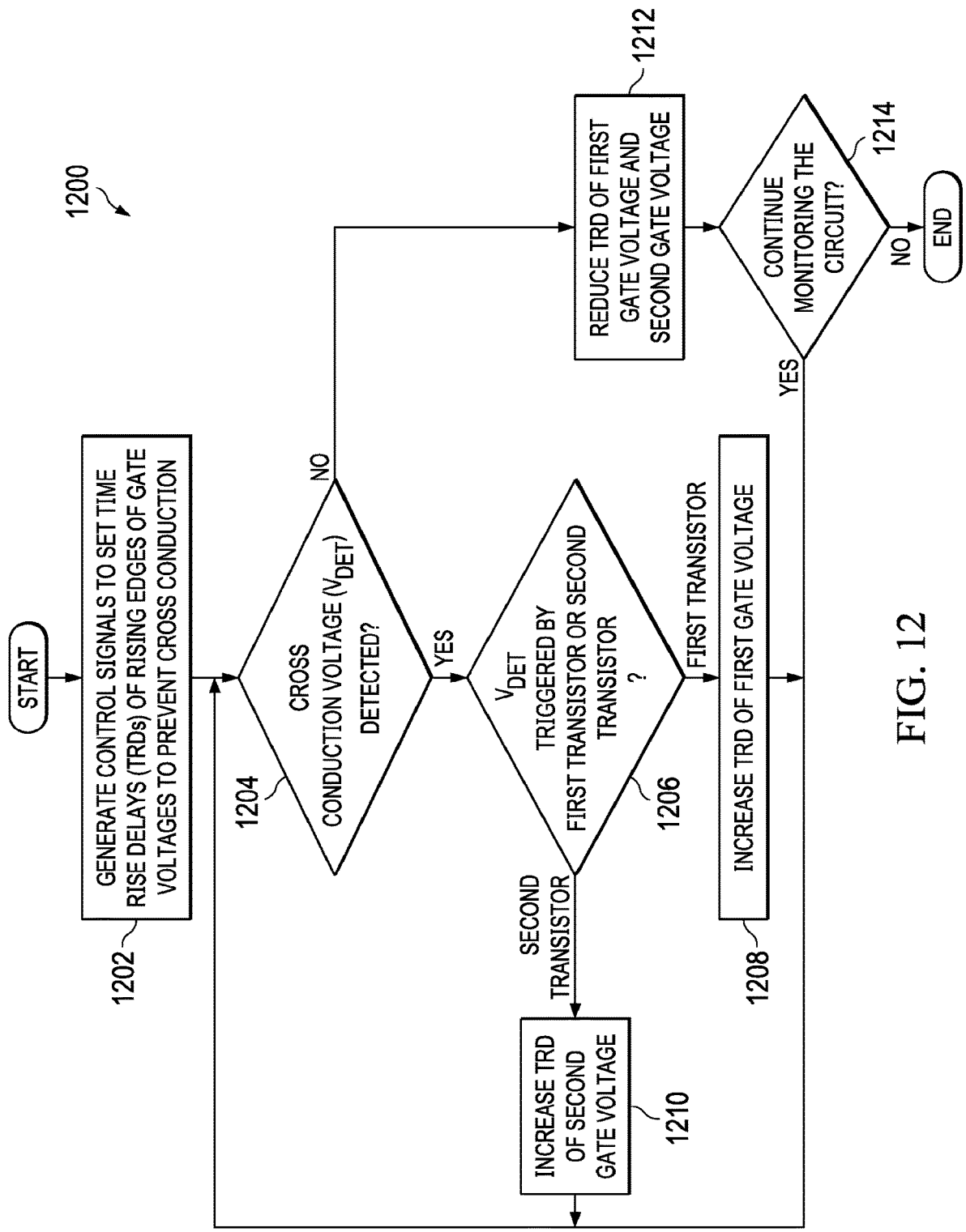
FIG. 12 is a flowchart representative of machine readable instructions that may be executed to implement the control circuit of FIG. 11 to generate a control signal based on identifying cross conduction.

A flowchart representative of example hardware logic, machine readable instructions, hardware implemented state machines, and/or any combination thereof for implementing the control circuit 162 of FIG. 1 is shown in FIG. 12. The machine readable instructions may be an executable program or portion of an executable program for execution by a computer processor such as the processor 1312 shown in the example processor platform 1300 discussed below in connection with FIG. 13. The program may be embodied in software stored on a non-transitory computer readable storage medium such as a CD-ROM, a floppy disk, a hard drive, a DVD, a Blu-ray disk, or a memory associated with the processor 1312, but the entire program and/or parts thereof could alternatively be executed by a device other than the processor 1312 and/or embodied in firmware or dedicated hardware. Further, although the example program is described with reference to the flowchart illustrated in FIG. 12, many other methods of implementing the control circuit 162 may alternatively be used. For example, the order of execution of the blocks may be changed, and/or some of the blocks described may be changed, eliminated, or combined. Additionally or alternatively, any or all of the blocks may be implemented by one or more hardware circuits (e.g., discrete and/or integrated analog and/or digital circuitry, an FPGA, an ASIC, a comparator, an operational-amplifier (op-amp), a logic circuit, etc.) structured to perform the corresponding operation without executing software or firmware.

As mentioned above, the example process of FIG. 12 may be implemented using executable instructions (e.g., computer and/or machine readable instructions) stored on a non-transitory computer and/or machine readable medium such as a hard disk drive, a flash memory, a read-only memory, a compact disk, a digital versatile disk, a cache, a random-access memory, and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc. may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, and (7) A with B and with C.

FIG. 12 is a flowchart representative of example machine readable instructions 1200 that may be executed to implement the control circuit 162 of FIGS. 1 and/or 11 to generate a control signal based on identifying cross conduction. The machine readable instructions 1200 begins at block 1202, at which the control circuit 162 generates control signals to set time rise delays (TRDs) of rising edges of gate voltages to prevent cross conduction. For example, the control signal generator 1130 of FIG. 11 may generate and transmit the maximum analog control voltage 508 or the maximum digital control voltage 606 to the first controlled delay circuit 150 and the second controlled delay circuit 152 to prevent the first cross-conduction current 156 from flowing through the first and second switching transistors 110, 112 of FIG. 1.

At block 1204, the control circuit 162 determines whether cross-conduction voltage ($V_{DET}$) is detected. For example, the cross-conduction detector 1110 of FIG. 11 may determine that the first cross-conduction current 156 is flowing through the first and second switching transistors 110, 112 of FIG. 1 based on receiving the cross-conduction voltage 160 from the cross detector circuit 154 of FIG. 1.

If, at block 1204, the control circuit 162 detects the cross-conduction voltage, then, at block 1206, the control circuit 162 determines whether $V_{DET}$ is triggered by a first transistor or a second transistor. For example, the transistor identifier 1120 of FIG. 11 may determine that the first switching transistor 110 of FIG. 1 triggered the cross conduction and, thus, triggered the cross detector circuit 154 to generate the cross-conduction voltage 160. For example, the transistor identifier 1120 may determine that the third rising edge 1030 of the first gate voltage 122 coincided with the presence of the first cross-conduction current 156 during the first cross conduction time 1004 of FIG. 10.

If, at block 1206, the control circuit 162 determines that the first transistor triggered $V_{DET}$, then, at block 1208, the control circuit 162 increases a TRD of a first gate voltage. For example, the control signal generator 1130 may generate and transmit the first control signal 164 to the first controlled delay circuit 150 to increase a TRD associated with the first gate voltage 122. In response to increasing the TRD of the first gate voltage, control returns to block 1204 to determine whether the cross-conduction voltage is detected.

If, at block 1206, the control circuit 162 determines that the second transistor triggered $V_{DET}$, control proceeds to block 1210 to increase a TRD of a second gate voltage. For example, the control signal generator 1130 may generate and transmit the second control signal 166 to the second controlled delay circuit 152 to increase a TRD associated with the second gate voltage 130. In response to increasing the TRD associated with the second gate voltage, control returns to block 1204 to determine whether the cross-conduction voltage is detected.

If, at block 1204, the control circuit 162 does not detect the cross-conduction voltage, control proceeds to block 1212 to reduce a TRD of the first gate voltage and the second gate voltage. For example, the control signal generator 1130 may (1) generate and transmit the first control signal 164 to the first controlled delay circuit 150 to reduce a TRD associated with the first gate voltage 122 and (2) generate and transmit the second control signal 166 to the second controlled delay circuit 152 to reduce a TRD associated with the second gate voltage 130.

In response to reducing the TRD of the first gate voltage and the second gate voltage, the control circuit 162 determines whether to continue monitoring the circuit. For example, the cross-conduction detector 1110 may determine to continue monitoring the cross detector circuit 154 for the cross-conduction voltage 160. If, at block 1214, the control circuit 162 determines to continue monitoring the circuit, control returns to block 1204 to determine whether the cross-conduction voltage is detected, otherwise the machine readable instructions 1200 of FIG. 12 conclude.

Figure 13:
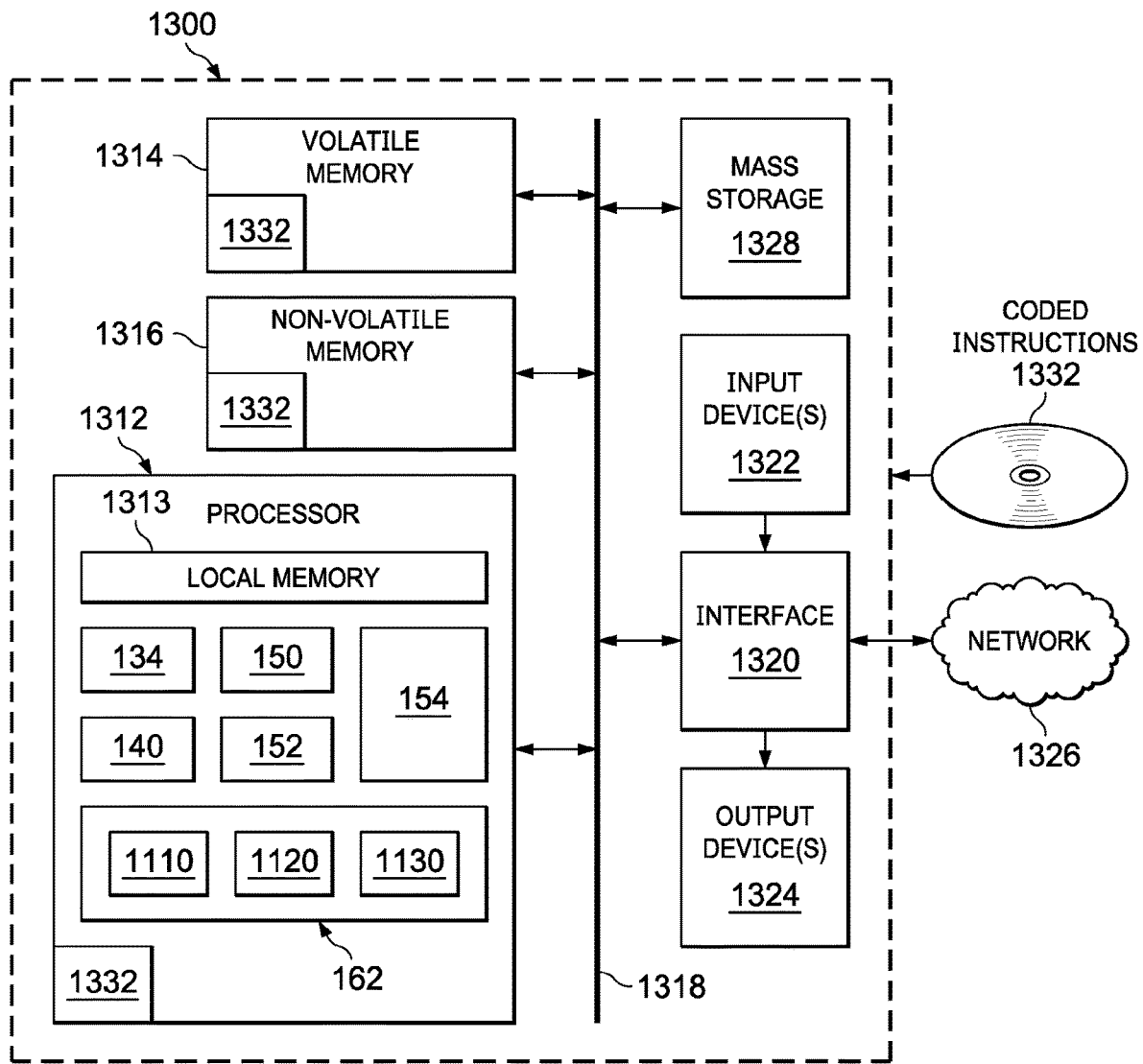
FIG. 13 is a block diagram of an example processing platform structured to execute the instructions of FIG. 12 to implement the control circuit of FIG. 11.

FIG. 13 is a block diagram of an example processor platform 1300 structured to execute the instructions of FIG. 12 to implement the control circuit 162 of FIGS. 1 and/or 11. The processor platform 1300 can be, for example, a server, a personal computer, a workstation, a self-learning machine (e.g., a neural network), a mobile device (e.g., a cell phone, a smart phone, a tablet such as an iPad™), a personal digital assistant (PDA), an Internet appliance, a DVD player, a CD player, a digital video recorder, a Blu-ray player, a gaming console, a personal video recorder, a set top box, a headset or other wearable device, or any other type of computing device.

The processor platform 1300 of the illustrated example includes a processor 1312. The processor 1312 of the illustrated example is hardware. For example, the processor 1312 can be implemented by one or more integrated circuits, logic circuits, microprocessors, GPUs, DSPs, or controllers from any desired family or manufacturer. The hardware processor may be a semiconductor based (e.g., silicon based) device. In this example, the processor 1312 implements the cross-conduction detector 1110, the transistor identifier 1120, and the control signal generator 1130 of FIG. 11.

The processor 1312 of the illustrated example includes a local memory 1313 (e.g., a cache). The processor 1312 of the illustrated example is in communication with a main memory including a volatile memory 1314 and a non-volatile memory 1316 via a bus 1318. The volatile memory 1314 may be implemented by Synchronous Dynamic Random Access Memory (SDRAM), Dynamic Random Access Memory (DRAM), RAMBUS® Dynamic Random Access Memory (RDRAM®), and/or any other type of random access memory device. The non-volatile memory 1316 may be implemented by flash memory and/or any other desired type of memory device. Access to the main memory 1314, 1316 is controlled by a memory controller.

The processor platform 1300 of the illustrated example also includes an interface circuit 1320. The interface circuit 1320 may be implemented by any type of interface standard, such as an Ethernet interface, a universal serial bus (USB), a Bluetooth® interface, a near field communication (NFC) interface, and/or a PCI express interface.

In the illustrated example, one or more input devices 1322 are connected to the interface circuit 1320. The input device(s) 1322 permit(s) a user to enter data and/or commands into the processor 1312. The input device(s) 1322 can be implemented by, for example, an audio sensor, a microphone, a camera (still or video), a keyboard, a button, a mouse, a touchscreen, a track-pad, a trackball, an isopoint device, and/or a voice recognition system.

One or more output devices 1324 are also connected to the interface circuit 1320 of the illustrated example. The output devices 1324 can be implemented, for example, by display devices (e.g., a light emitting diode (LED), an organic light emitting diode (OLED), a liquid crystal display (LCD), a cathode ray tube display (CRT), an in-place switching (IPS) display, a touchscreen, etc.), a tactile output device, a printer, and/or speaker. The interface circuit 1320 of the illustrated example, thus, typically includes a graphics driver card, a graphics driver chip, and/or a graphics driver processor.

The interface circuit 1320 of the illustrated example also includes a communication device such as a transmitter, a receiver, a transceiver, a modem, a residential gateway, a wireless access point, and/or a network interface to facilitate exchange of data with external machines (e.g., computing devices of any kind) via a network 1326. The communication can be via, for example, an Ethernet connection, a digital subscriber line (DSL) connection, a telephone line connection, a coaxial cable system, a satellite system, a line-of-site wireless system, a cellular telephone system, etc.

The processor platform 1300 of the illustrated example also includes one or more mass storage devices 1328 for storing software and/or data. Examples of such mass storage devices 1328 include floppy disk drives, hard drive disks, compact disk drives, Blu-ray disk drives, redundant array of independent disks (RAID) systems, and digital versatile disk (DVD) drives.

The machine executable instructions 1332 of FIG. 11 may be stored in the mass storage device 1328, in the volatile memory 1314, in the non-volatile memory 1316, and/or on a removable non-transitory computer readable storage medium such as a CD or DVD.

From the foregoing, it will be appreciated that example methods, apparatus, and articles of manufacture have been disclosed that reduce and/or otherwise optimize a dead time between power switching operations such as turning on a first switching transistor and turning off a second switching transistor. Examples disclosed herein can directly measure a cross-conduction current flowing between a pair of switching transistors when the pair are substantially simultaneously enabled. By directly measuring the cross-conduction current, examples disclosed herein can generate control signals to affect gate voltages controlling the pair of switching transistors. Examples disclosed herein improve an efficiency and noise robustness of a power converter by minimizing a delay time between power switching operations without impacting cross conduction of the switching transistors coupled to the power converter.

Example 1 includes an apparatus, comprising a cross detector circuit including a first transistor and a second transistor, the first transistor coupled to a load, a third transistor coupled to a first controlled delay circuit and the first transistor, a fourth transistor coupled to a second controlled delay circuit and to the third transistor at a phase node, and a control circuit coupled to the first controlled delay circuit, the second controlled delay circuit, and the load.

Example 2 includes the apparatus of example 1, further comprising a first fixed delay circuit coupled to the first controlled delay circuit, and a second fixed delay circuit coupled to the second controlled delay circuit.

Example 3 includes the apparatus of example 2, wherein at least one of the first fixed delay circuit or the second fixed delay circuit is a counter or an RC network coupled to a buffer.

Example 4 includes the apparatus of example 2, wherein the first transistor, the second transistor, the third transistor, and the fourth transistor are N-channel metal oxide semiconductor field effect transistors, a first drain of the first transistor coupled to the load and the control circuit, a first source of the first transistor coupled to a second drain of the second transistor, a first gate of the first transistor coupled to a third gate of the third transistor and the first controlled delay circuit, a second gate of the second transistor coupled to a fourth gate of the fourth transistor and the second controlled delay circuit, a third source of the third transistor coupled to a fourth drain of the fourth transistor at the phase node.

Example 5 includes the apparatus of example 2, wherein the first transistor, the second transistor, the third transistor, and the fourth transistor are P-channel metal oxide semiconductor field effect transistors, a first drain of the first transistor coupled to a second source of the second transistor, a first gate of the first transistor coupled to a third gate of the third transistor and the first controlled delay circuit, a second drain of the second transistor coupled to the load and the control circuit, a second gate of the second transistor coupled to a fourth gate of the fourth transistor and the second controlled delay circuit, and a third drain of the third transistor coupled to a fourth source of the fourth transistor at the phase node.

Example 6 includes an apparatus, comprising a controlled delay circuit coupled to a first transistor, the controlled delay circuit to delay a rising edge of a gate voltage to operate the first transistor, a cross detector circuit coupled to the first transistor and a second transistor to measure a cross-conduction current flowing through the first transistor and the second transistor, and a control circuit coupled to the controlled delay circuit and the cross detector circuit, the control circuit to generate a control voltage to modify the rising edge based on the cross-conduction current.

Example 7 includes the apparatus of example 6, further comprising a fixed delay circuit coupled to the controlled delay circuit to receive an input signal from an input node, delay a falling edge of the input signal to generate a fixed delay signal, and transmit the fixed delay signal to the controlled delay circuit.

Example 8 includes the apparatus of example 6, wherein the controlled delay circuit is configured to obtain a fixed delay signal from a fixed delay circuit, delay a rising edge of the fixed delay circuit to generate a gate voltage, and apply the gate voltage to the first transistor.

Example 9 includes the apparatus of example 6, wherein the controlled delay circuit is a first controlled delay circuit, further comprising a first fixed delay circuit coupled to the first controlled delay circuit to delay a falling edge of a first input signal obtained from an input node, and a second fixed delay circuit coupled to a second controlled delay circuit to delay a falling edge of a second input signal obtained from the input node via an inverter, the second controlled delay circuit coupled to the second transistor and the control circuit.

Example 10 includes the apparatus of example 6, wherein the first transistor and the second transistor are NPN bipolar junction transistors or PNP bipolar junction transistors.

Example 11 includes the apparatus of example 6, wherein the cross detector circuit comprises a third transistor and a fourth transistor, the third transistor coupled to the first transistor and a load, the fourth transistor coupled to the second transistor and the third transistor, the load to generate a voltage based on the cross-conduction current.

Example 12 includes the apparatus of example 11, wherein the first transistor, the second transistor, the third transistor, and the fourth transistor are N-channel metal oxide semiconductor field effect transistors or P-channel metal oxide semiconductor field effect transistors.

Example 13 includes the apparatus of example 11, wherein the cross conduction current is a first cross-conduction current, the cross detector circuit to generate the voltage based on a second cross-conduction current flowing through the load when the first cross-conduction current flows through the first transistor and the second transistor, the second cross-conduction current smaller than the first cross-conduction current.

Example 14 includes a system, comprising a phase switching network coupled to a converter at a phase node, the phase switching network comprising a switching transistor network including a first transistor and a second transistor, and a cross conduction control circuit comprising a cross detector circuit including a third transistor and a fourth transistor, and a control circuit to detect a first cross-conduction current flowing through the first transistor and the second transistor by measuring a second cross-conduction current flowing through the third transistor and the fourth transistor, the first cross-conduction current greater than the second cross-conduction current.

Example 15 includes the system of example 14, wherein the converter is a boost converter, a buck converter, or a buck-boost converter.

Example 16 includes the system of example 14, wherein the cross conduction control circuit further comprises a first fixed delay circuit coupled to a first controlled delay circuit, a second fixed delay circuit coupled to a second controlled delay circuit, and the control circuit coupled to the first controlled delay circuit, the second controlled delay circuit, and the cross detector circuit.

Example 17 includes the system of example 16, wherein at least one of the first fixed delay circuit or the second fixed delay circuit is to delay a falling edge of an input signal obtained from an input node.

Example 18 includes the system of example 16, wherein the first controlled delay circuit is configured to obtain a fixed delay signal from the first fixed delay circuit, delay a rising edge of the fixed delay signal to generate a gate voltage, and transmit the gate voltage to the first transistor.

Example 19 includes the system of example 16, wherein the second controlled delay circuit is configured to obtain a fixed delay signal from the second fixed delay circuit, delay a rising edge of the fixed delay signal to generate a gate voltage, and transmit the gate voltage to the second transistor.

Example 20 includes the system of example 14, wherein the third transistor is coupled to a load, and the control circuit is to measure the second cross-conduction current based on a voltage generated by the load.

Example 21 includes the system of example 20, wherein the control circuit is configured to generate a control voltage based on the voltage to modify a rising edge of a gate voltage to be applied to at least one of the first transistor or the second transistor.

Example 22 includes a method, comprising detecting a voltage of a load based on a cross-conduction current flowing through a first transistor and a second transistor, in response to detecting the voltage, determining whether one of the first transistor or the second transistor triggered the cross conduction current, and in response to determining that the first transistor triggered the cross-conduction current, increasing a first delay of a first rising edge of a first gate voltage to be applied to the first transistor, and in response to determining that the second transistor triggered the cross-conduction current, increasing a second delay of a second rising edge of a second gate voltage to be applied to the second transistor.

Example 23 includes the method of example 22, further comprising in response to not detecting the voltage, reducing the first delay and the second delay.

Example 24 includes the method of example 22, wherein increasing at least one of the first delay or the second delay comprises generating a control voltage based on the detected voltage, mapping the control voltage to at least one of the first delay or the second delay, and delaying at least one of the first rising edge or the second rising edge based on at least one of the first delay or the second delay.

Example 25 includes the method of example 22, further comprising operating a converter based on at least one of the first gate voltage or the second gate voltage, the converter including at least one of a boost converter, a buck converter, or a buck-boost converter.

Although certain example methods, apparatus, and articles of manufacture have been disclosed herein, the scope of coverage of this patent is not limited thereto. On the contrary, this patent covers all methods, apparatus, and articles of manufacture fairly falling within the scope of the claims of this patent.

What is claimed is:

1. An apparatus, comprising:
 a cross detector circuit having first and second transistors, wherein the first transistor is coupled to a load;
 a third transistor coupled to a first controlled delay circuit and to the first transistor;
 a fourth transistor coupled to a second controlled delay circuit and to the third transistor at a phase terminal;
 a control circuit coupled to the first controlled delay circuit, the second controlled delay circuit, and the load;
 a first fixed delay circuit coupled to the first controlled delay circuit; and
 a second fixed delay circuit coupled to the second controlled delay circuit.

2. The apparatus of claim 1, wherein at least one of the first fixed delay circuit or the second fixed delay circuit is a counter or an RC network coupled to a buffer.

3. The apparatus of claim 1, wherein the first transistor, the second transistor, the third transistor, and the fourth transistor are N-Channel field effect transistors (NFETs), in which a first drain of the first transistor is coupled to the load and to the control circuit, a first source of the first transistor is coupled to a second drain of the second transistor, a first gate of the first transistor is coupled to a third gate of the third transistor and the first controlled delay circuit, a second gate of the second transistor is coupled to a fourth gate of the fourth transistor and the second controlled delay circuit, and a third source of the third transistor is coupled to a fourth drain of the fourth transistor at the phase terminal.

4. The apparatus of claim 1, wherein the first transistor, the second transistor, the third transistor, and the fourth transistor are P-Channel field effect transistors (PFETs), in which a first drain of the first transistor is coupled to a second source of the second transistor, a first gate of the first transistor is coupled to a third gate of the third transistor and the first controlled delay circuit, a second drain of the second transistor is coupled to the load and the control circuit, a second gate of the second transistor is coupled to a fourth gate of the fourth transistor and the second controlled delay circuit, and a third drain of the third transistor is coupled to a fourth source of the fourth transistor at the phase terminal.

5. The apparatus of claim 1, wherein the first controlled delay circuit is configured to:
   receive a fixed delay signal from the first fixed delay circuit;
   delay a rising edge of the fixed delay signal to generate a gate voltage; and
   transmit the gate voltage to the first transistor.

6. The apparatus of claim 1, wherein the second controlled delay circuit is configured to:
   obtain a fixed delay signal from the second fixed delay circuit;
   delay a rising edge of the fixed delay signal to generate a gate voltage; and
   transmit the gate voltage to the second transistor.

7. The apparatus of claim 1, wherein the control circuit is configured to:
   detect a first cross-conduction current flowing through the first transistor and the second transistor by measuring a second cross-conduction current flowing
   through the third transistor and the fourth transistor, the first cross-conduction current greater than the second cross-conduction current; and
   generate a control voltage responsive to a voltage generated by a load to modify a rising edge of a gate voltage to be applied to the first transistor.

* * * * *